United States Patent
Mendenhall et al.

(10) Patent No.: US 11,722,100 B2
(45) Date of Patent: Aug. 8, 2023

(54) AUDIO AMPLIFIER WITH FAST WAKE-UP POWER SUPPLY AND PEAK CURRENT REDUCTION

(71) Applicant: RGB Systems, Inc., Anaheim, CA (US)

(72) Inventors: Eric Mendenhall, Trabuco Canyon, CA (US); Jason Todd Muroki, Irvine, CA (US)

(73) Assignee: RGB Systems, Inc., Anaheim, CA (US)

( * ) Notice: Subject to any disclaimer, the term of this patent is extended or adjusted under 35 U.S.C. 154(b) by 40 days.

(21) Appl. No.: 17/540,082

(22) Filed: Dec. 1, 2021

(65) Prior Publication Data

US 2023/0170849 A1    Jun. 1, 2023

(51) Int. Cl.
*H04R 3/00*    (2006.01)
*H03F 3/217*   (2006.01)
*H03F 1/02*    (2006.01)

(52) U.S. Cl.
CPC ........... *H03F 1/0211* (2013.01); *H03F 3/217* (2013.01); *H04R 3/00* (2013.01); *H03F 2200/03* (2013.01)

(58) Field of Classification Search
CPC .... H03F 1/0211; H03F 3/217; H03F 2200/03; H04R 3/00
USPC ........................................................ 381/120
See application file for complete search history.

(56) References Cited

U.S. PATENT DOCUMENTS

| 2016/0373076 | A1* | 12/2016 | Buono | ................... H03F 3/2173 |
| 2017/0229917 | A1* | 8/2017 | Kurs | ....................... H02J 50/12 |
| 2019/0326822 | A1* | 10/2019 | Asao | ....................... H02M 1/44 |

FOREIGN PATENT DOCUMENTS

| EP | 3 503 686 A1 | 6/2019 |
| JP | 4 566566 B2 | 10/2010 |

OTHER PUBLICATIONS

European Search Report in European Patent Application No. 22208526.8, dated Apr. 3, 2023 in 8 pages.

* cited by examiner

*Primary Examiner* — Vivian C Chin
*Assistant Examiner* — Friedrich Fahnert
(74) *Attorney, Agent, or Firm* — Knobbe, Martens, Olson & Bear, LLP

(57) ABSTRACT

An improved audio amplifier system can both reduce power consumption by supporting a standby mode and shorten wake time when resuming from the standby mode. The audio amplifier system may reduce power by entering a sleep or standby state in response to a command and/or detecting that an audio input signal is not received. Further, the audio amplifier system may use a burst generator to periodically or intermittently activate the power supply during standby mode. By periodically or intermittently activating the power supply, one or more of the capacitors may be charged. By charging the capacitors during standby mode, the time to wake from standby mode may be significantly reduced. In some cases, the wake time may be reduced by several order of magnitudes (e.g., from seconds to milliseconds).

20 Claims, 10 Drawing Sheets

AUDIO AMPLIFIER WITH FAST WAKE-UP POWER SUPPLY AND PEAK CURRENT REDUCTION

INCORPORATION BY REFERENCE

This application incorporates by reference in its entirety for all purposes U.S. application Ser. No. 17/540,066, which is titled "AUDIO AMPLIFIER WITH FAST WAKE-UP POWER SUPPLY" and is filed on Dec. 1, 2021, the same filing date as the present application. Any and all applications for which a foreign or domestic priority claim is identified in the Application Data Sheet as filed with the present application are hereby incorporated by reference under 37 CFR 1.57.

FIELD OF THE DISCLOSURE

The present disclosure relates to audio amplifiers. More specifically, the present disclosure relates to operating the power supply of an audio amplifier in a standby mode.

BACKGROUND

Audio amplifiers are often used to amplify an audio signal before providing the audio amplifier to a speaker. One common type of amplifier used to implement an audio amplifier is a class D amplifier. A class D amplifier is a switching amplifier in which the transistors of the amplifier operate as electronic switches. Typically, the transistors switch back and forth between a pair of supply rails. Often, the class D amplifier is controlled using a voltage mode controller.

The audio amplifier may be powered by a power supply circuit. When the audio amplifier is turned on, the power supply may receive power from a power source (e.g., a connection to the mains or power grid). When the audio amplifier is deactivated, the power supply of the audio amplifier may cease to receive power from the power source.

SUMMARY

The systems, methods and devices of this disclosure each have several innovative aspects, no single one of which is solely responsible for all of the desirable attributes disclosed herein. Details of one or more implementations of the subject matter described in this specification are set forth in the accompanying drawings and the description below.

Certain aspects of the present disclosure relate to an audio amplifier. The audio amplifier may include: a power amplifier configured to amplify an input audio signal to obtain an amplified audio signal and output the amplified audio signal to a speaker; an isolated power supply comprising one or more capacitors and a burst mode input configured to receive a burst mode signal, wherein the burst mode signal indicates whether the audio amplifier is in a standby state, wherein, when the burst mode signal indicates that the audio amplifier is in the standby state, the isolated power supply cycles between an active state for a first segment of a time period and an inactive state for a second segment of the time period, and wherein the one or more capacitors of the isolated power supply are charged when the isolated power supply is in the active state; a burst generator configured to generate the burst mode signal in response to a control signal and to provide the burst mode signal to the burst mode input; and a controller configured to generate the control signal based on a determination that the audio amplifier is in the standby state.

The audio amplifier of the preceding paragraph can include any combination or sub-combination of the following features: where the power amplifier comprises a class D amplifier; where the audio amplifier further comprises a standby user interface element configured to generate a standby signal in response to a user interaction with the standby user interface element; where the controller determines that the audio amplifier is in the standby state in response to the standby signal; where the controller determines that the audio amplifier is in the standby state in response to not detecting the input audio signal for a threshold period of time; where the power amplifier comprises a power supply configured to provide power to the power amplifier, wherein the power supply comprises the isolated power supply and a power factor correction circuit connectable to a main power supply; where the first segment of the time period is at least an order of magnitude less than the second segment of the time period; where the isolated power supply further comprises a pulse width modulator configured to regulate a power supply voltage when the isolated power supply is in the active state; where charging the one or more capacitors of the isolated power supply when in the standby state reduces a wake time of the audio amplifier when exiting the standby state compared to when the one or more capacitors are uncharged; and where the time period is one of a set of successive time periods, and wherein the isolated power supply cycles between the active state for the first segment of each time period and the inactive state for the second segment of each time period.

Additional aspects of the present disclosure relate to a method of controlling an audio amplifier that supports a standby mode with fast wake-up. The method may include: receiving a command to cause the audio amplifier to enter the standby mode; generating a control signal to enter the standby mode in response to the command; activating a burst generator configured to generate a burst mode signal in response to the control signal and to provide the burst mode signal to a burst mode input of an isolated power supply; and in response to the isolated power supply receiving the burst mode signal, activating the isolated power supply for a first segment of a time period and deactivating the isolated power supply for a second segment of the time period, wherein activating the isolated power supply for the first segment of the time period comprises charging one or more capacitors of the isolated power supply.

The method of the preceding paragraph can include any combination or sub-combination of the following features: where the command to enter the standby mode is received in response to a user interaction with a standby user interface element; where the command to enter the standby mode is received in response to not detecting an input audio signal for a threshold period of time; where the method further includes repeating for one or more successive time periods a cycle of activating the isolated power supply for a first segment of a time period and deactivating the isolated power supply for a second segment of the time period; where the method further includes: determining that the audio amplifier is to wake-up from the standby mode; deactivating the burst generator; and activating the isolated power supply until the audio amplifier is turned off or reenters the standby mode; where the first segment of the time period is substantially shorter than the second segment of the time period; and where activating the isolated power supply comprises activating a pulse width modulator configured to regulate a power supply voltage when the isolated power supply is in an active state.

Additional aspects of the present disclosure relate to an audio system. The audio system may include: a speaker configured to output audio based on an audio signal; and an audio amplifier in communication with the speaker and configured to provide the audio signal to the speaker for output as the audio. The audio amplifier may include: a power amplifier configured to amplify an input audio signal to obtain the audio provided to the speaker for output; an isolated power supply configured to power the power amplifier and comprising one or more capacitors and a burst mode input configured to receive a burst mode signal, wherein the burst mode signal indicates whether the audio amplifier is in a standby state, wherein, when the burst mode signal indicates that the audio amplifier is in the standby state, the isolated power supply cycles between an active state for a first segment of a time period and an inactive state for a second segment of the time period, and wherein the one or more capacitors of the isolated power supply are charged when the isolated power supply is in the active state; a burst generator configured to generate the burst mode signal in response to a control signal and to provide the burst mode signal to the burst mode input; and a controller configured to generate the control signal based on a determination that the audio amplifier is in the standby state.

The audio system of the preceding paragraph can include any combination or sub-combination of the following features: where the controller determines that the audio amplifier is in the standby state in response to a user interaction with a standby user interface element or in response to not detecting receipt of the input audio signal for a minimum period of time; and where the time period defines one of a set of periodic cycles where the isolated power supply cycles between the active state for a first portion of each cycle and the inactive state for a second portion of each cycle.

Certain aspects of the present disclosure relate to an audio amplifier. The audio amplifier may include: a power amplifier configured to amplify an input audio signal to obtain an amplified audio signal and output the amplified audio signal to a speaker; and an isolated power supply comprising one or more capacitors, a duty cycle ramp generator, and a burst mode input configured to receive a burst mode signal indicating whether the audio amplifier is in a standby state, wherein, when the burst mode signal indicates that the audio amplifier is in the standby state, the isolated power supply cycles between an active state and an inactive state, and wherein the duty cycle ramp generator ramps a duty cycle of a gate driver from a minimum duty cycle to a maximum duty cycle during the active state to charge the one or more capacitors of the isolated power supply.

The audio amplifier of the preceding paragraph can include any combination or sub-combination of the following features: where the minimum duty cycle is less than 10% and the maximum duty cycle is at least 80%; where the duty cycle ramp generator includes a ramping circuit configured to control the ramping of the gate driver from the minimum duty cycle to the maximum duty cycle; where the minimum duty cycle is configured in response to a duty cycle control signal; where the audio amplifier further includes a counter configured to generate the duty cycle control signal; where the audio amplifier further includes a burst generator configured to generate the burst mode signal in response to a control signal and to provide the burst mode signal to the burst mode input; where the audio amplifier further includes a controller configured to generate the control signal based on a determination that the audio amplifier is in the standby state; where charging the one or more capacitors of the isolated power supply when in the standby state reduces a wake time of the audio amplifier when transitioning from the standby state to an on state compared to when the one or more capacitors are uncharged; where a length of time that the isolated power supply is in the active state during standby mode is at least a magnitude less than a length of time that the isolated power supply is in the inactive state; and where the gate driver is one of a pair of gate drivers included in the isolated power supply, and wherein the pair of gate drivers alternatingly turn on a corresponding pair of transistors to charge the one or more capacitors of the isolated power supply when the isolated power supply is in the active state.

Additional aspects of the present disclosure relate to a method of controlling an audio amplifier that supports a standby mode with fast wake-up. The method may include: receiving a command to cause the audio amplifier to enter the standby mode; generating a control signal to enter the standby mode in response to the command; activating a burst generator configured to generate a burst mode signal in response to the control signal and to provide the burst mode signal to a burst mode input of an isolated power supply; and in response to the isolated power supply receiving the burst mode signal, charging one or more capacitors of the isolated power supply over a first time period by at least ramping a duty cycle of a gate driver of the isolated power supply from a first duty cycle to a second duty cycle that is higher than the first duty cycle; and ceasing to charge the one or more capacitors by at least deactivating the gate driver during a second time period.

The method of the preceding paragraph can include any combination or sub-combination of the following features: where the method further includes, in response to the isolated power supply receiving the burst mode signal, periodically repeating said charging of the one or more capacitors and said ceasing to charge the one or more capacitors; where ceasing to charge the one or more capacitors comprises supplying a low gate driver control signal to the gate driver; where the first time period is a magnitude of time shorter than the second time period; where the method further includes determining that the audio amplifier is to exit the standby mode; deactivating the burst generator; and activating the isolated power supply; and where the command to cause the audio amplifier to enter the standby mode is received in response to at least one of: a user interaction with a standby user interface element or detecting an absence of an input audio signal for a threshold period of time.

Additional aspects of the present disclosure relate to an audio system. The audio system may include: a speaker configured to output audio; and an audio amplifier in communication with the speaker and configured to provide an audio signal to the speaker, wherein the speaker outputs the audio based on the audio signal, wherein the audio amplifier comprises: a power amplifier configured to amplify an input audio signal to obtain the audio signal and output the audio signal to the speaker; and an isolated power supply configured to power the power amplifier, the isolated power supply comprising one or more capacitors, a duty cycle ramp generator, and a burst mode input configured to receive a burst mode signal indicating whether the audio amplifier is in a standby state, wherein, when the burst mode signal indicates that the audio amplifier is in the standby state, the isolated power supply cycles between an active state and an inactive state, and wherein the duty cycle ramp generator ramps a duty cycle of a gate driver from a minimum duty cycle to a maximum duty cycle during the active state to charge the one or more capacitors of the isolated power supply.

The audio system of the preceding paragraph can include any combination or sub-combination of the following features: where the duty cycle ramp generator includes a ramping circuit configured to control the ramping of the gate driver from the minimum duty cycle to the maximum duty cycle; where the ramping circuit comprises a transistor configured to charge a capacitor of an RC circuit to ramp the duty cycle of the gate driver; and where the audio system further includes a burst generator configured to generate the burst mode signal in response to a control signal associated with entering the standby state and to provide the burst mode signal to the burst mode input.

BRIEF DESCRIPTION OF THE DRAWINGS

Throughout the drawings, reference numbers are re-used to indicate correspondence between referenced elements. The drawings are provided to illustrate certain aspects of the subject matter described herein and not to limit the scope thereof.

DETAILED DESCRIPTION

Introduction

Certain types of amplifiers (e.g., audio amplifiers) may be used to amplify an audio signal. An amplified audio signal output by the audio amplifier may be provided as input to a speaker, which may output audio. There are different types of amplifiers that may be used as an audio amplifier, such as class B and class D amplifiers. A class D amplifier can include transistors used to switch between different rail voltages and is typically not a linear gain device. The switches of the class D amplifier may be switched rapidly between the supply rails +Vrail and −Vrail. The class D amplifier may be implemented using field-effect transistors (FETs), such as metal-oxide-semiconductor field-effect transistors (MOSFETs).

The audio amplifier includes a power supply that powers the electronic components of the audio amplifier. The power supply may include a number of different components used to maintain a steady current or a particular voltage. For example, the power supply may include an AC/DC converter designed to convert alternating current (AC) to direct current (DC), one or more capacitors to maintain the output of the power supply at a constant voltage, a transformer to transfer electrical energy from a primary winding to a secondary winding without affecting frequency, a grounding rectifier to isolate the secondary winding from the primary source, one or more filters to keep ripple components from appearing on the output, a voltage regulator, etc.

It is generally desirable to reduce power consumption and to make an audio amplifier as energy efficient as possible. One method of reducing power consumption is through the use of a standby mode. By incorporating circuitry in the audio amplifier to place the audio amplifier in standby mode, power consumption can be reduced compared to when the audio amplifier is maintained in an active or fully operational mode. In standby mode, much of the circuitry may be shut down. The idle power of the power supply may be relatively significant. For example, the idle power may be on the order of 20 W. Thus, standby mode may include shutting down the power supply circuitry.

Figure 1:
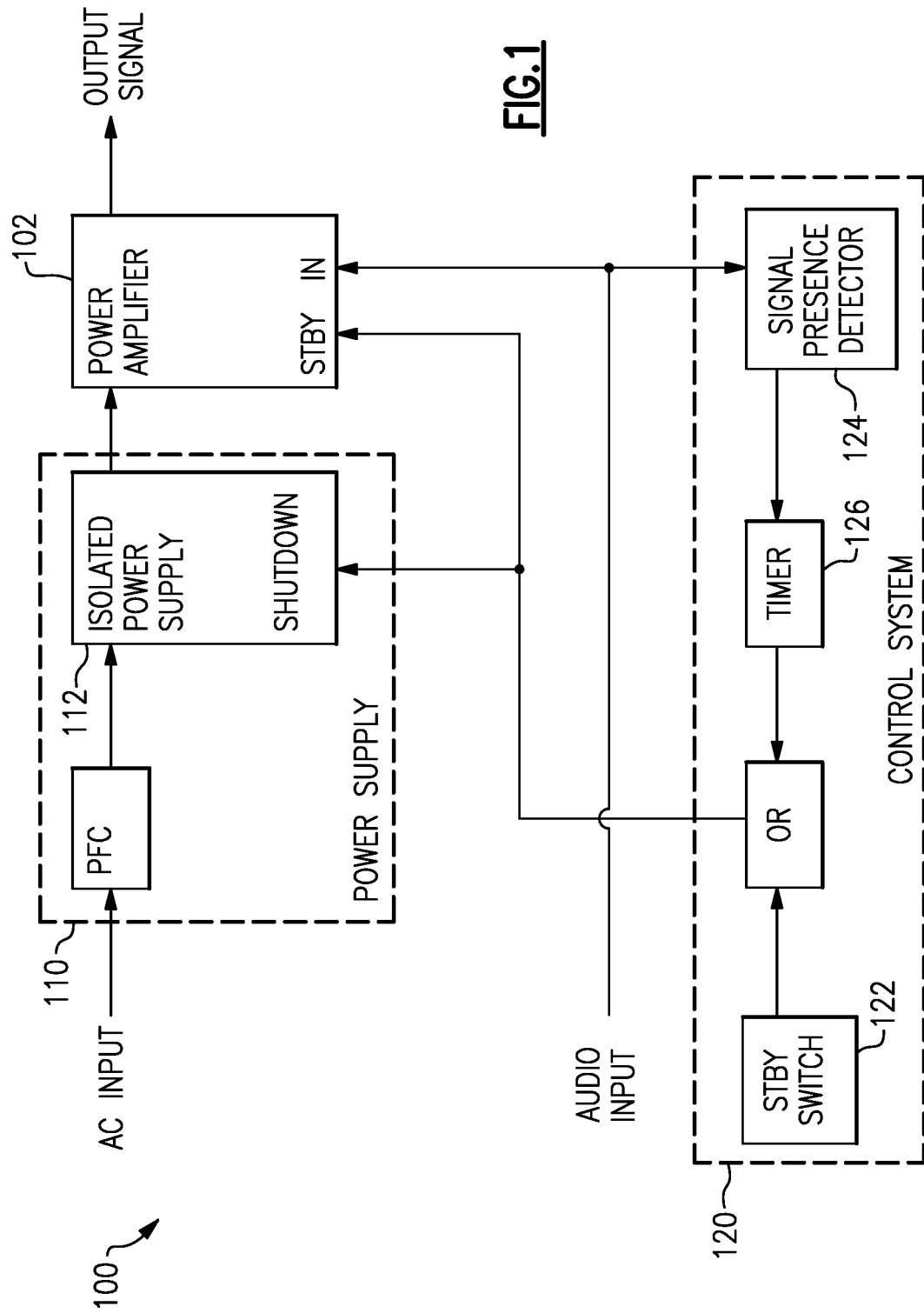
FIG. 1 illustrates a block diagram of an example audio amplifier system.

FIG. 1 illustrates a block diagram of an example audio amplifier system 100. The audio amplifier system 100 may include a power amplifier 102 configured to amplify an audio input signal and to output the amplified audio signal to a speaker (not shown). Further, the audio amplifier system 100 may include a power supply 110 and a control system 120. The power supply 110 may receive power or a voltage supply (typically an alternating current, AC, input) from a connection to a power source. This voltage supply may be from a mains or a connection to a power grid. Alternatively, or in addition, the voltage supply may be received from an off-grid source, such as a battery or generator. The power supply may include an isolated power supply 112 that can prevent dangerous high voltages from being passed along to subsequent circuit elements that may be damaged by a high voltage. Further, in some cases the power supply may perform one or more addition operations, such as converting the AC input to a DC power supply signal.

The control system 120 may control whether the power supply 110 is in active mode, or in sleep or standby mode. When the power supply 110 is in active mode, the power supply 110 may function normally including supplying power to the power amplifier 102 to amplify the audio input signal. When the power supply 110 is in sleep or standby mode, the isolated power supply 112 is shut down and does not supply power to the power amplifier 102. In such cases, an audio input signal would not be amplified and/or output to a speaker. The control system 120 may place the power supply 110 in sleep or standby mode by shutting down the isolated power supply 112 in response to a user interacting with a standby switch 122 and/or in response to the control system 120 determining, using a signal presence detector 124 and a timer 126, that an audio input signal is not received for a threshold period of time.

Advantageously, shutting down the isolated power supply 112 can reduce power usage when the audio amplifier system 100 is idle and/or is not processing an audio input signal. As mentioned above, shutting down the isolated power supply 112 can save significant power consumption on the order of 20 W. When the audio amplifier system 100 is in sleep or standby mode, it may be awoken by a user interacting with the standby switch 122 and/or in response to detecting receipt of an audio input signal. Waking up the audio amplifier system 100 may include activating the isolated power supply 112. Activating or waking up the isolated power supply 112 may be non-instantaneous because, for example, capacitors (not shown) of the isolated power supply 112 take time to charge on startup (or wakeup). In some cases, the isolated power supply 112 may take on the order of two seconds to wake from shutdown or standby mode. It is generally desirable for wake time to be significantly shorter (e.g., on the order of 1-2 ms).

Embodiments of the present disclosure relate to an improved audio amplifier system that both reduces power consumption and shortens wake time when resuming from a standby or sleep mode. The audio amplifier system may reduce power consumption by entering a sleep or standby state in response to a command and/or detecting that an audio input signal is not received. Further, the audio amplifier system may use a burst generator to periodically or intermittently activate the power supply during standby mode. By periodically or intermittently activating the power supply, one or more of the capacitors may be charged. By charging the capacitors during standby mode, the time to wake from standby mode may be significantly reduced. In some cases, the wake time may be reduced by several order of magnitudes (e.g., from seconds to milliseconds).

Additional embodiments of the present disclosure relate to an improved audio amplifier system that includes a ramp generator that can modify the duty cycle of the power supply during burst mode. The modified duty cycle may begin from a minimum duty cycle and ramp up to a maximum duty cycle over time during each, or at least some, burst cycle occurring during burst mode. Advantageously, ramping the duty cycle when charging the capacitors of an isolated power supply can reduce a peak current draw of the power supply, which can provide additional power savings of as much as up to 50% over the non-ramped burst mode.

Example Audio Amplifier System

Figure 2:
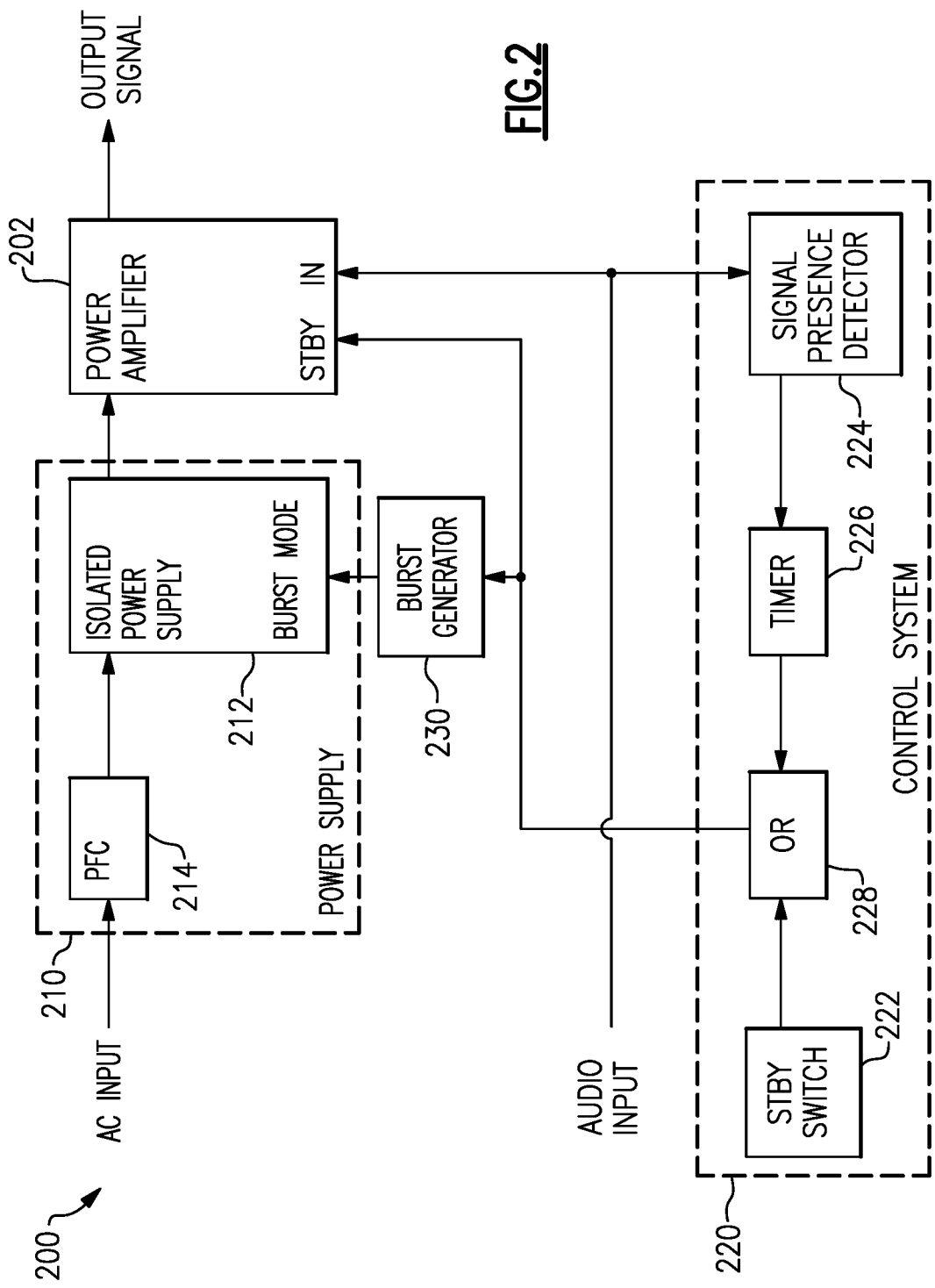
FIG. 2 illustrates a block diagram of a second example audio amplifier system in accordance with certain embodiments.

FIG. 2 illustrates a block diagram of an example audio amplifier system 200 with fast wake-up in accordance with certain embodiments. The audio amplifier system 200 may include one or more of the elements described with respect to the audio amplifier system 100. Further, the audio amplifier system 200 may include a power amplifier 202, a power supply 210, a control system 220, and a burst generator 230.

The power amplifier 202 may include any type of amplifier configured to amplify an audio input signal and to output the amplified audio signal to a speaker (not shown). For example, the power amplifier 202 may be a class D amplifier, or switching amplifier, (e.g., the class D amplifier 500 illustrated in FIG. 5), a class AB amplifier, a class B amplifier, a class G amplifier, a class H amplifier, or any other amplifier that may be used in the audio context. The power amplifier 202 may receive power from the power supply 210. Further, the power amplifier 202 may receive the audio input signal from an audio input port. In some cases, when the audio amplifier system 200 is in standby mode, the power amplifier 202 may cease to receive power from the power supply 210. Moreover, in some cases, the power amplifier 202 may separately receive a standby or sleep signal that deactivates the power amplifier 202. When the power amplifier 202 receives the standby signal, the power amplifier may cease to amplify the audio input signal and/or cease to output the amplified audio signal to a subsequent circuit element (e.g., a speaker).

The power supply 210 may provide power to the power amplifier 202. In some cases, the power supply 210 may be configured to provide multiple rail voltages to the power amplifier 202. Further, the power supply may provide power to one or more additional circuit elements (e.g., filters, user interface circuits, voltage overprotection circuit, etc.) that are omitted for simplicity from FIG. 2. The power supply 210 may be configured to receive power from a power source (e.g., a connection to a power grid, a battery, or a generator, etc.). This power may be received as an Alternating Current (AC) signal. The power supply 210 may convert the AC signal to a Direct Current (DC) signal. Further, the power supply 210 may modify (e.g., step-down) the voltage received from the power source.

The power supply 210 may include a power factor correction (PFC) circuit 214 and an isolated power supply 212, among other circuits that are omitted for simplicity (e.g., voltage overprotection circuits, timers, or filters). The PFC circuit 214 may include any circuit that can reduce the reactive power component of an AC circuit to improve its efficiency and reduce current. Further, the PFC circuit 214 may bring a power factor close to 1.0 and/or reduce harmonics in the power signal. In some cases, the PFC circuit 214 may use switching or partial switching to reduce the occurrence of drawing "peaky" current, or current draw only at the peak of a sinusoidal line voltage. In other words, the PFC circuit 214 may be used to draw a sinusoidal current.

The isolated power supply 212 may include any circuit that can isolate the power input or primary voltage from the power output or secondary voltage of the power supply 210. The isolated power supply 212 may include a transformer (not shown) that can convert the primary voltage to the secondary voltage. Further, the transformer may step down the voltage. The isolated power supply 212 may further include one or more capacitors (e.g., capacitors C7 and C8 illustrated in FIG. 6) that are charged to facilitate providing a steady secondary voltage to the power amplifier 202.

The isolated power supply 212 may further include burst mode circuitry that, responsive to a control input from a burst generator 230, charges the one or more capacitors of the isolated power supply 212. In other words, in certain embodiments, when receiving a control signal from the burst generator 230, the isolated power supply may enter an active state. During this active state, the one or more capacitors of the isolated power supply 212 may be charged. When the burst generator 230 ceases to provide the control signal, the isolated power supply 212 may exit the active state (e.g., enter a standby, sleep, or inactive state). When not in the active state, the one or more capacitors of the isolated power supply 212 may cease being charged and/or may discharge. In some cases, rather than ceasing to provide the control signal when the isolated power supply 212, the burst generator 230 may provide a control signal to cause the isolated power supply 212 to enter the inactive or standby state.

The burst generator 230 may include any system that can control whether the isolated power supply 212 is in an active state or in an inactive state, which may also be referred to as a standby or sleep state. Moreover, when the audio amplifier system 200 is in a sleep or standby state, the burst generator 230 may cause the isolated power supply 212 to alternate periodically between active and inactive states. When the audio amplifier system 200 is in an active or on state, the burst generator 230 may be inactive and/or may cause the isolated power supply 212 to remain in an active state. Although illustrated and described as a separate system, in some cases, the burst generator 230 may be implemented as part of the power supply 210 and/or part of the control system 220.

Figure 3A:
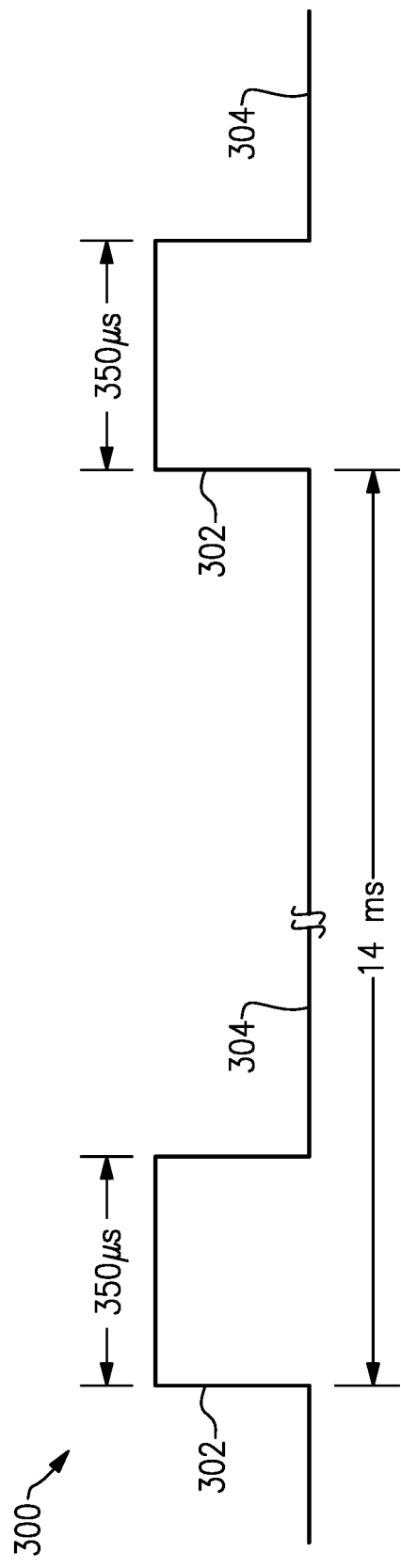
FIGS. 3A and 3B illustrate example timing diagrams for operation of a power supply of the audio amplifier operating in standby mode in accordance with certain embodiments.
Figure 3B:
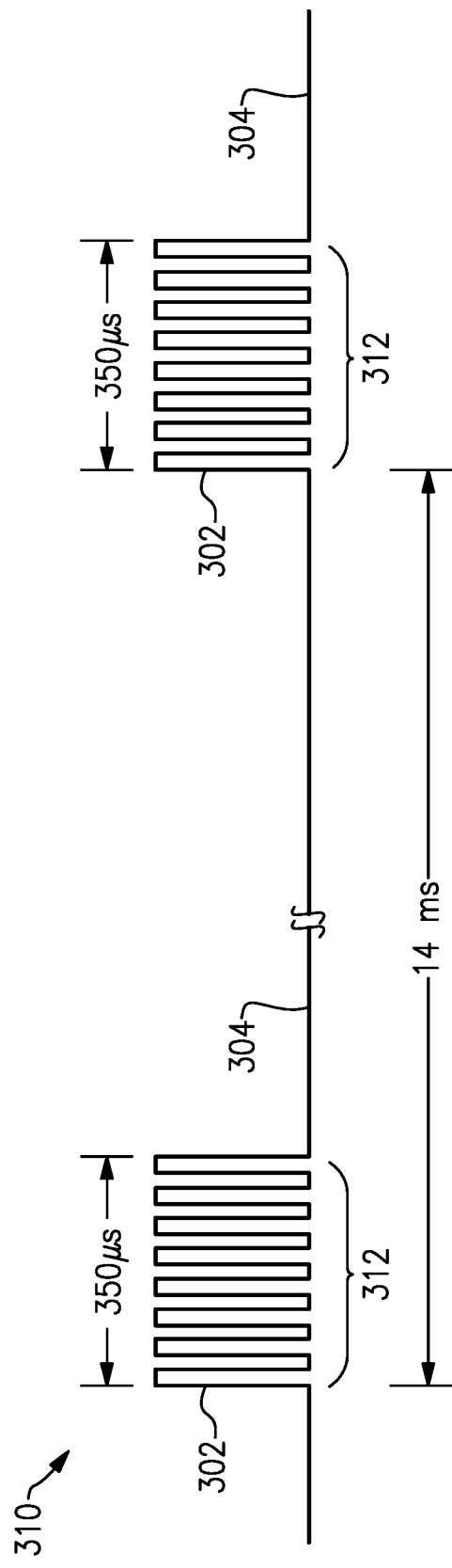

The control system 220 may include any circuit that can control whether the burst generator 230 is active (e.g., normal operating mode or ON mode) and/or whether the burst generator 230 causes the isolated power supply 212 to enter a burst mode where the isolated power supply 212 is active for a period of time and then inactive for a period of time (e.g., standby or sleep mode). Further, when in the burst mode, the isolated power supply 212 may be configured to cycle between active and inactive states. In some cases when operating in a standby mode, a single cycle may comprise a single period of time when the isolated power supply 212 is in the active state combined with a single period of time when the isolated power supply is in the inactive state. This single cycle may be repeated on a periodic basis. Further, within the single cycle, the period of time when the isolated power supply 212 is in the active state and the single period of time when the isolated power supply 212 is in the inactive state may be the same, but typically will differ. FIGS. 3A and 3B illustrate graphs of embodiments where the length of time, per cycle, when the isolated power supply 212 is in the active state and when the isolated power supply 212 is in the inactive state differ when operating in standby mode.

The control system 220 may include a standby switch 222, a signal presence detector 224, a timer 226, and digital logic 228. The standby switch 222 may include any type of switch with which a user can indicate a desire to place the audio amplifier system 200 in standby or sleep mode. Moreover, the standby switch 222 is not limited to a switch, but can include any type of user interface element that can be used to place in the audio amplifier system 200 in standby or sleep mode. For example, the standby switch 222 may be a toggle switch, a button, a slide element, a knob, and the like. In some cases, the standby switch 222 may include a touchscreen that presents one or more user interface screens and/or control elements with which the user may control the audio amplifier system 200. Moreover, in some cases, the standby switch 222 may be replaced with or may include a transceiver that can receive a control signal from another electronic system, such as a remote control or a wireless device (e.g., a smartphone or smartwatch) that may communicate using one or more wireless standards. In some cases, the wireless standards may include short range communication standards, such as Bluetooth®.

The signal presence detector 224 may include any circuit that can detect the presence and/or absence of a signal, such as an audio input signal. The signal presence detector 224 may include one or more filters than can filter out noise. The signal presence detector 224 may output a control or detect signal indicating the presence and/or absence of the audio input signal. The detect signal may be provided to the timer 226. The timer 226 may count a period of time that the audio input signal is absent or not detected. If the timer 226 determines, based on the detect signal, that the audio input signal is not present for a threshold period of time, a signal may be supplied to the digital logic 228 indicating the absence of an audio input signal. In some cases, there may be pauses in audio. For example, the audio may include instances of silence. As another example, there may be breaks between audio tracks as, for example, a new song is selected or an audio input source is changed. It is generally desirable that the audio amplifier system 200 not enter standby or sleep mode during the relatively brief periods of a lack of audio signal. Advantageously, the inclusion of the timer 226 can prevent the audio amplifier system 200 from entering standby or sleep mode during momentary or relatively brief absences of audio input signals.

The digital logic 228 may include any type of logic that can supply a control signal to the burst generator 230 based on the standby switch 222 output and/or the timer 226 output. For example, the digital logic 228 may include an OR switch or a NAND gate. When the digital logic 228 determines that the standby switch 222 is active or that the combination of the signal presence detector 224 and the timer 226 does not detect an audio input signal for a threshold period of time, the digital logic 228 provides a control signal to the burst generator 230 that initiates the burst generator 230 and places the isolated power supply 212 in a standby or sleep mode. As previously explained, during the standby mode, the burst generator 230 may cycle between activating and deactivating the isolated power supply 212. In certain cases, the isolated power supply 212 may be deactivated for significantly longer periods of time that the isolated power supply 212 is active. In some cases, the isolated power supply 212 is only activated for a long enough period of time to maintain one or more capacitors of the isolated power supply 212 with a particular charge level.

It should be understood that the audio amplifier system 200 is a simplified block diagram of an audio amplifier system in accordance with certain embodiments described herein. The audio amplifier system 200 may include one or more additional elements that, for simplicity and not to limit the present disclosure, are not illustrated. For example, the audio amplifier system 200 may include one or more additional amplifiers, filters, user interface circuitry, etc.

Example Standby Mode Timing

As previously described, when the audio amplifier system 200 is in standby mode, the burst generator 230 may cause the isolated power supply 212 to function in a burst mode. During the burst mode, the isolated power supply 212 may operate in periodic cycles with each cycle including both an active and inactive mode, or state. The portion of each cycle when the isolated power supply 212 is active is typically, although not necessarily, substantially smaller than the portion of each cycle when the isolated power supply 212 is inactive.

FIGS. 3A and 3B illustrate example timing diagrams for operation of a power supply 210 of the audio amplifier system 200 operating in standby mode in accordance with certain embodiments. In certain implementations, the PFC circuit 214 does not draw significant power compared to the isolated power supply 212. Thus, in some such cases, the PFC circuit 214 can be omitted from being controlled by the burst generator 230. Accordingly, the burst generator 230 may only control the isolated power supply 212. Thus, FIGS. 3A and 3B illustrate example timing diagrams for operation of the isolated power supply 212 of the audio amplifier system 200 operating in standby mode in accordance with certain embodiments FIG. 3A illustrates an example graph 300 of the output of the burst generator 230. As explained above, when the audio amplifier system 200 is in a standby mode, the burst generator 230 may operate in cycles. In the illustrated example graph 300, the cycles are each 14 milliseconds long. However, it should be understood that the cycles may be of any length of time. For example, the cycles may be 10 ms, 12 ms, 20 ms, etc. Moreover, the cycle length may be selected based on the size of the capacitors to charge, a minimum charge level desired for the capacitors, the number of capacitors to charge, a desired wake time for the audio amplifier system, or any other characteristic of the audio amplifier system 200 that may affect the wake time of the audio amplifier system 200.

Within each cycle, there may be a portion of time when the burst generator 230 actives the isolated power supply 212 as represented by the logic high segments 302 of the graph 300. Further, within each cycle there may be a portion of time when the burst generator 230 maintains the isolated power supply 212 in an off-state or a deactivated state as represented by the logic low segments 304 of the graph 300. As illustrated, the logic high segments 302 when the isolated power supply 212 is active may be significantly shorter than the logic low segments 304 when the isolated power supply 212 is inactive. In some cases, the logic high segments 302 may be one or more orders of magnitude shorter than the logic low segments 304. For example, the logic high segments 302 may be 350 microseconds in length while the logic low segments 304 may be the remainder of the 14 ms cycle, or 13.65 ms. It should be understood that the logic high segments 302 and the logic low segments 304 may be of different lengths. For example, the isolated power supply 212 may be activated for 1 ms, during the logic high segments 302, and may be deactivated for 10 ms, during the logic low segments 304. As indicated above, the length of time the isolated power supply 212 is active and/or inactive may be based at least in part on the design of the audio amplifier system 200 and, in particular, the one or more capacitors to be maintained in a charged state. By maintaining the one or more capacitors in a charged state, wake time can be shortened from, for example, seconds to milliseconds (e.g., from 2 seconds to 2 milliseconds). Moreover, the inclusion of the standby state can reduce power consumption from 20 W or more to 1 W or less.

The example cycles illustrated in FIG. 3A each begin with a period when the isolated power supply 212 is active and end with a period when the isolated power supply 212 is inactive. However, it should be understood that the present disclosure is not limited as such. For example, the cycles may start with the isolated power supply 212 being inactive and end with the isolated power supply 212 being active. As another example, the segment of the cycle when the isolated power supply 212 is active may be in the middle or during some other subsection of the illustrated 14 ms cycle. In other words, the illustrated 14 ms cycle may have multiple sub periods of time when the isolated power supply 212 is inactive. Further, in some cases, there may be multiple sub periods of time when the isolated power supply 212 is active. For example, the burst generator 230 may activate the isolated power supply 212 multiple times within one cycle and/or deactivate the isolated power supply 212 multiple times within one cycle of a set of periodic cycles.

As described above, the burst generator 230 may activate the isolated power supply 212 when the burst generator 230 output is logic high and deactivate the isolated power supply 212 when the burst generator 230 output is logic low. However, it should be understood that the selection of logic high and logic low is a matter of convention and that it is possible for the isolated power supply 212 to be activated when the output of the burst generator 230 is logic low and deactivated when the output of the burst generator 230 is logic high.

In some cases, the burst generator 230 may gate the pulse width modulator of the isolated power supply 212 when the audio amplifier system 200 is in standby mode. During the portion of the duty cycle when the isolated power supply 212 is active, the PWM may continue to function as normal in the standby mode as it would function when the audio amplifier system 200 is in normal or the ON operating mode. Thus, for example, if the PWM operates at 100 kHz when the audio amplifier system 200 is in normal operating mode, the PWM may continue to operate at 100 kHz when the audio amplifier system 200 is in standby mode and the burst generator 230 is outputting a logic high signal. In some cases, the PWM generates a gate drive signal that drives a gate of the isolated power supply 212 to cause the isolated power supply to charge the capacitors. Further, in some implementations, the PWM may be replaced by gate drive circuits.

FIG. 3B illustrates an example graph 310 of the output of the burst generator 230 with the PWM waveform. The graph 310 is the same as the graph 300, but the graph 310 additionally illustrates the function of the PWM of the isolated power supply 212. As illustrated by the square waves 312, during the periods when the output of the burst generator 230 is logic high and the isolated power supply 212 is active, the PWM may continue to operate as when the audio amplifier system 200 is operating in a normal on state. In contrast, when in the standby mode, and the output of the burst generator 230 is logic low, the PWM may cease to operate at the 100 kHz duty cycle, as illustrated by the lack of square wave when the output of the burst generator 230 is logic low.

Example Audio Amplifier Control Process

Figure 4:
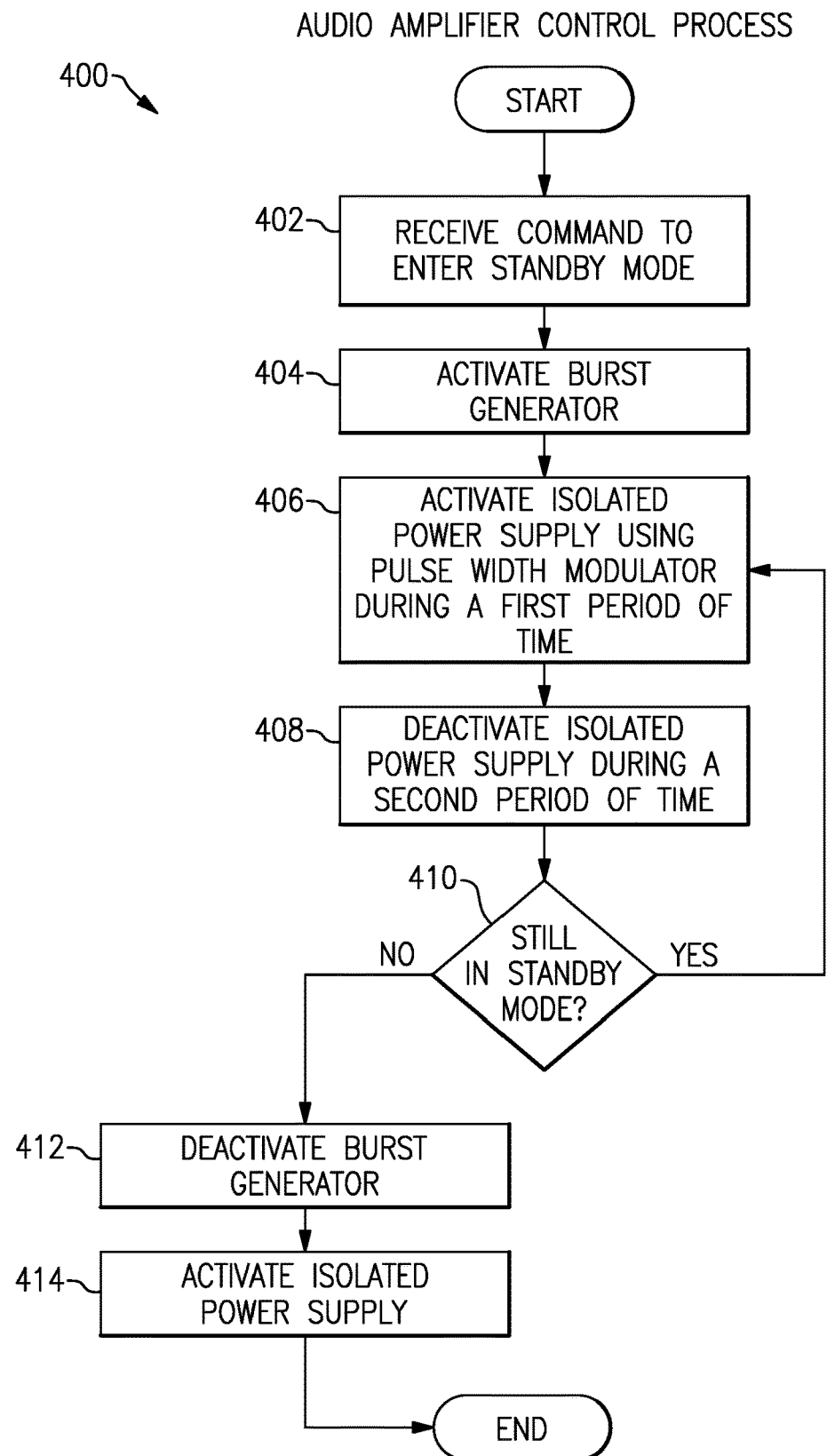
FIG. 4 presents a flowchart of an example audio amplifier control process in accordance with certain embodiments.

FIG. 4 presents an example flow diagram of an example audio amplifier control process 400 in accordance with certain embodiments. Some or all of the process 400 can be implemented by an audio amplifier system 200, a control system 220, a burst generator 230, a power supply 210, components thereof, or by any of the systems described herein. Although some elements of the process 400 may be implemented by a number of different systems, to simplify discussion elements of the process 400 will be described with respect to particular systems.

The process 400 begins at block 402 where the control system 220 of the audio amplifier system 200 receives a command to enter a standby mode. The command to enter the standby mode may be received in response to a user engaging or otherwise interacting with a standby switch 222 or other standby user interface element that is configured to generate a standby signal in response to a user interaction with the standby user interface element. In some cases, the command to enter the standby mode may be received from a remote controller or other electronic device that can transmit the command to enter the standby mode to the control system 220. Alternatively, or in addition, the command to enter the standby mode may be generated automatically by, for example, the signal presence detector 224 and/or the timer 226. The command to enter the standby mode may be automatically generated when the control system 220, using the signal presence detector 224 and/or the timer 226, determines that an audio input signal is not being received or has not been received for a threshold period of time.

In some embodiments, the audio amplifier system 200 may enter standby mode when, or shortly after, the audio amplifier system 200 is first turned on, or is first turned on without an audio input signal being received at startup. In some such cases, the audio amplifier system 200 remains in standby mode until an audio input signal is detected. In other embodiments, the audio amplifier system 200 starts up in a normal operating mode and may enter the standby mode after a threshold period of time without receiving an audio input signal elapses.

When the command to enter standby mode is received, the isolated power supply 212 may be deactivated. When the isolated power supply 212 is deactivated, a supply voltage is not provided to the power amplifier 202. As previously described, the power amplifier 202 may include any type of amplifier including, for example, a class D amplifier. In some cases, the power amplifier 202 represents the output stage of the audio amplifier system 200.

At block 404, the control system 220 activates the burst generator 230. Activating the burst generator 230 may cause the burst generator 230 to generate a burst mode signal. The burst mode signal may be provided to an input of the isolated power supply 212. In some cases, the burst mode signal cycles between an on/off or a high/low value. In other cases, the burst mode signal may be supplied periodically or intermittently while during some periods of time the burst mode signal is withheld or not supplied to the isolated power supply 212 by the burst generator 230.

At block 406, the burst generator 230 activates the isolated power supply 212 during a first period of time. In some embodiments, the isolated power supply 212 may include a pulse width modulator. In some such embodiments, the block 406 may include activating the pulse width modulator of the isolated power supply 212. Activating the isolated power supply 212 may include providing the burst mode signal generated by the burst generator 230 to the isolated power supply 212. In some cases, activating the isolated power supply 212 may include operating a pulse width modulator that regulates a power supply voltage when the isolated power supply is in the active state. Further, activating the isolated power supply 212 may include charging one or more capacitors of the isolated power supply 212. In some implementations, activating the isolated power supply 212 may include causing a gate driver to drive a signal across a primary coil of a transformer, which in turn may cause a voltage or signal across a secondary coil of the transformer. The signal across the secondary coil may be rectified by a rectification circuit and then may charge a set of capacitors. By charging the capacitors, a power amplifier that is powered by the power supply 210 may be activated more quickly while consuming less power compared to a system that does not maintain a standby mode as disclosed herein.

At block 408, the burst generator 230 deactivates the isolated power supply 212 during a second period of time. The second period of time in combination with the first period of time may comprise a single cycle of activating and deactivating the isolated power supply 212 (e.g., as represented by one occurrence of logic high segment 302 and the logic low segment 304 illustrated in FIGS. 3A and 3B). This cycle combining the first period of time and the second period of time may be repeated periodically until such time as the audio amplifier system 200 is no longer in the standby mode as described below. Each cycle may define a time period with the first period of time being a first segment of the time period that defines the cycle and the second period of time being a second segment of the time period that defines the cycle. Further, as explained below, in some cases the cycle (or any subsequent cycle) may be interrupted during either the first period of time or the second period of time.

As previously explained, the use of "first" and "second" to distinguish the periods of time or segments of the time period are not intended to specify an order, but are used to distinguish the two segments of the time period or cycle. In some cases, the order in which the isolated power supply 212 is active or inactive within a cycle may differ. Further, the period during which the isolated power supply 212 is active may be interleaved with multiple periods or inactivity within a single cycle. The length of each of the first and second segments of the time period or cycle may be the same, but typically they differ. For example, the first period or segment of time may be an order of magnitude less than the second period or segment of time. In some cases, the first period of time may be $\frac{1}{40}^{th}$ the length of the second period of time.

Deactivating the isolated power supply 212 may include ceasing to providing the burst mode signal generated by the burst generator 230 to the isolated power supply 212. Alternatively, the burst mode signal may continue to be provided, but the value of the burst mode signal may indicate that the isolated power supply 212 is to be deactivated. Further, deactivating the isolated power supply 212 may include ceasing to operate the PWM. Moreover, deactivating the isolated power supply 212 may include ceasing to charge one or more capacitors of the isolated power supply 212.

Advantageously, by activating the isolated power supply 212 for a period of time during standby mode, one or more capacitors of the isolated power supply 212 may remain charged or charged at least a threshold amount. Moreover, by maintaining a minimum level of charge for the one or more capacitors, an amount of time (e.g., a wake time) for the audio amplifier system 200 to wake up from standby or sleep mode may be reduced compared to when the one or more capacitors are uncharged. In other words, embodiments of the present disclosure may shorten the wake time of the audio amplifier system 200 compared to when the audio amplifier system is first activated or is awakened from a standby mode that does not maintain the one or more capacitors at a minimum charge level. For example, it may take up to 2 or more seconds to wake an audio amplifier system from standby or sleep mode. However, embodiments of the present disclosure can awaken significantly faster, such as on the order of 2 ms or less.

At decision block 410, the control system 220 determines whether the audio amplifier system 200 remains in standby mode. Determining whether the audio amplifier system 200 remains in the standby mode may include determining whether a command to exit standby mode has been received. The command to exit the standby mode may be received in response to a user engaging or otherwise interacting with a standby switch 222 or other standby user interface element that is configured to generate a signal to exit standby mode and/or is configured to cease generating a signal to enter standby mode in response to a user interaction with the standby user interface element. In some cases, the command to exit the standby mode may be received from a remote controller or other electronic device that can transmit the command to exit the standby mode to the control system 220. Alternatively, or in addition, the command to exit the standby mode may be generated automatically by, for example, the signal presence detector 224 and/or the timer 226. The command to exit the standby mode may be automatically generated when the control system 220, using the signal presence detector 224 and/or the timer 226, determines that an audio input signal is being received. Alternatively, when the audio signal is being received, the command to enter standby mode may cease being generated by, for example, the signal presence detector 224 and/or the timer 226. In other words, in some cases, the control system 220 may generate a command signal to exit standby mode and/or in other cases, the control system 220 may cease generating a command signal to enter standby mode in response to a user action and/or receipt of an audio input signal.

The operations associated with the decision block 410 may be performed after each cycle. In other words, after each occurrence of the first period of time associated with the block 406 and the second period of time associated with the block 408. Alternatively, the operations associated with the decision block 410 may be performed more or less frequently. For example, the operations associated with the decision block 410 may be performed 2, 3, or more times a cycle defined by the sum of the first period of time and the second period of time. As another example, the operations associated with the decision block 410 may be performed on a continuous basis. Moreover, in some cases, the operations associated with the decision block 410 may not be an active set of operations that are performed but may be triggered in response to receiving a command (e.g., receiving a command to exit standby mode), or ceasing to receive a command (e.g., ceasing to receive the standby mode command). In other words, in some cases, the decision block 410 may be similar to receiving an interrupt command that interrupts an ongoing process (e.g., the operations associated with the blocks 406 and 408).

If it is determined that the audio amplifier system 200 remains in standby mode, the process 400 returns to the block 406 where the burst generator 230 continues to cycle between activating the isolated power supply 212 at the block 406 (an active state) and deactivating the isolated power supply 212 at the block 408 (an inactive state) until such time that it is determined at the decision block 410 that the audio amplifier system 200 is no longer in standby mode. The cycles between the active and inactive states may occur for a set of one or more successive time periods. In some embodiments, if the audio amplifier system 200 is determined to be in standby mode for a threshold period of time, or a threshold number of cycles or successive time periods, the audio amplifier system 200 may automatically turn off.

If it is determined at the decision block 410 that the audio amplifier system 200 is not in standby mode, the control system 220 deactivates the bust generator 230 at the block 412. Deactivating the burst generator 230 may including providing a signal from the control system 220 to cause the burst generator 230 to deactivate and/or to cause the burst generator 230 to cease providing the burst mode signal to the isolated power supply 212.

At block 414, the control system 220 activates the isolated power supply 212. Activating the isolated power supply 212 may include causing the isolated power supply 212 to remain active or on. In some cases, the control system 220 activates the isolated power supply 212 by causing the PWM to operate continuously. In some embodiments, the operations associated with the blocks 412 and 414 may be combined. For example, in some cases, causing the burst generator 230 to cease providing the burst mode signal to the isolated power supply 212 may cause the isolated power supply 212 to transition to an ON state. In some cases, the operations associated with the blocks 412 and 414 may cause the burst generator 230 to provide a signal to the isolated power supply 212 to operate in the ON state, or a normal operating state rather than the standby state. During the ON or normal operating state, the isolated power supply 212 may operate as designed and may supply power to the power amplifier 202 to amplify an audio input signal enabling the amplified audio signal to be output to a speaker.

The audio amplifier system 200 may remain in the ON state until the audio amplifier system 200 is turned OFF or the standby mode is triggered again. The standby mode may be triggered by one or more of the embodiments disclosed with respect to the block 402. Once the standby mode is triggered again, the audio amplifier system may reenter the standby mode.

Example Amplifier Output Stage

Figure 5:
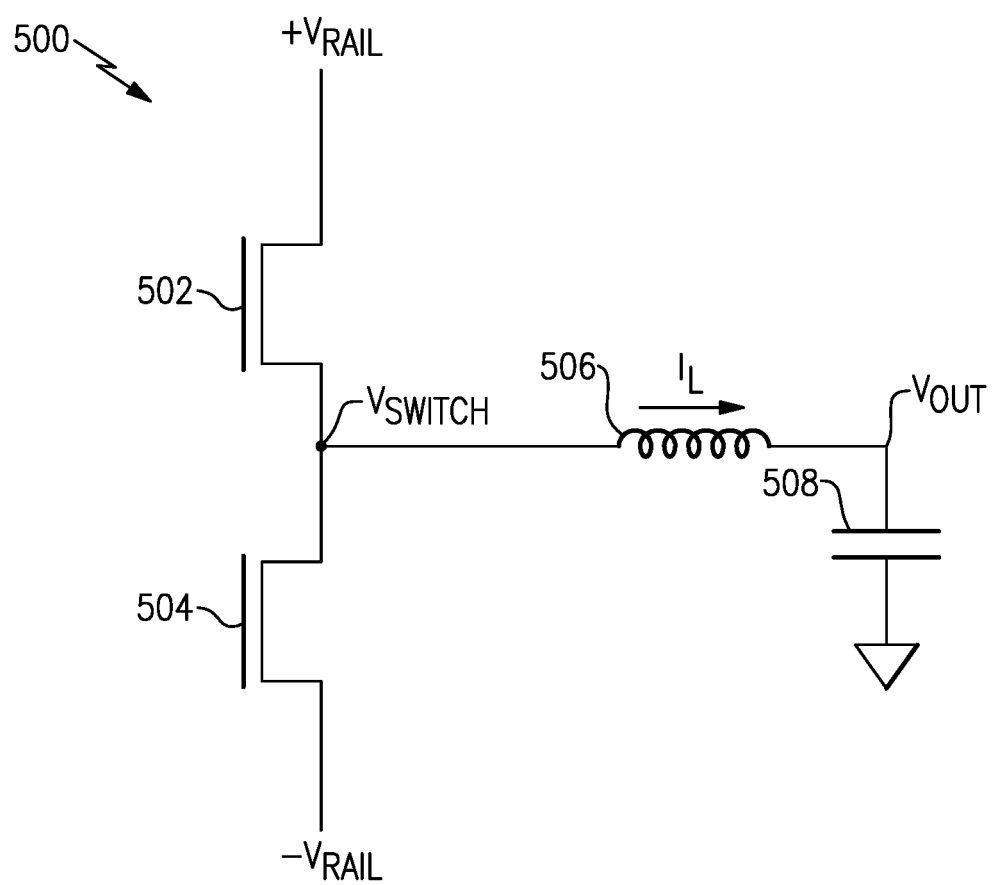
FIG. 5 illustrates a circuit diagram of a portion of an audio amplifier in accordance with certain embodiments.

As previously described, the power amplifier 202 may include any type of audio amplifier. For example, the power amplifier 202 may be a class D amplifier. FIG. 5 illustrates a circuit diagram of a portion of a class D audio amplifier in accordance with certain embodiments. More specifically, FIG. 5 illustrates a simplified circuit diagram of an output stage 500 of an example class D amplifier in accordance with certain embodiments. It should be understood that the power amplifier 202 may include additional stages and/or circuitry in addition to the output stage 500. The output stage 500 is one non-limiting example of an output stage that can be used for the power amplifier 202 of the audio amplifier system 200.

The illustrated portion of the class D amplifier in FIG. 5 illustrates an output stage 500 implemented by a pair of transistors and an output LC filter. The output LC filter may be formed from one or more inductors 506 and one or more capacitors 508. As stated above, a number of additional elements (e.g., the power supply 210) may form part of the audio amplifier system that incorporates the output stage 500. The output stage 500 may include a pair of switches 502 and 504 implemented by transistors. These transistors 502, 504 may be field-effect transistors (FETs), such as metal-oxide-semiconductor FETs (MOSFETs). The switch 502 may be connected to +Vrail and the switch 504 may be connected to −Vrail. Further, the switches 502 and 504 may alternate between on and off states with one switch being on while the other switch is off. Thus, when the switches are active, the output or switch voltage Vswitch, may alternate between +Vrail and −Vrail.

It should be understood that FIG. 5 illustrates one non-limiting example of the output stage of a class D amplifier. Other implementations are possible.

Further, as previously described, the amplifier may include a filter, such as an LC filter that includes one or more inductors 506 and one or more capacitors 508. When the output stage 500 is active, a current may flow through the inductor 506 charging the inductor 506 and, in some cases, the capacitor 508. An output signal may appear at the node Vout, which can be provided to a subsequent system, such as a speaker system.

Example Power Supply Circuit

Figure 6:
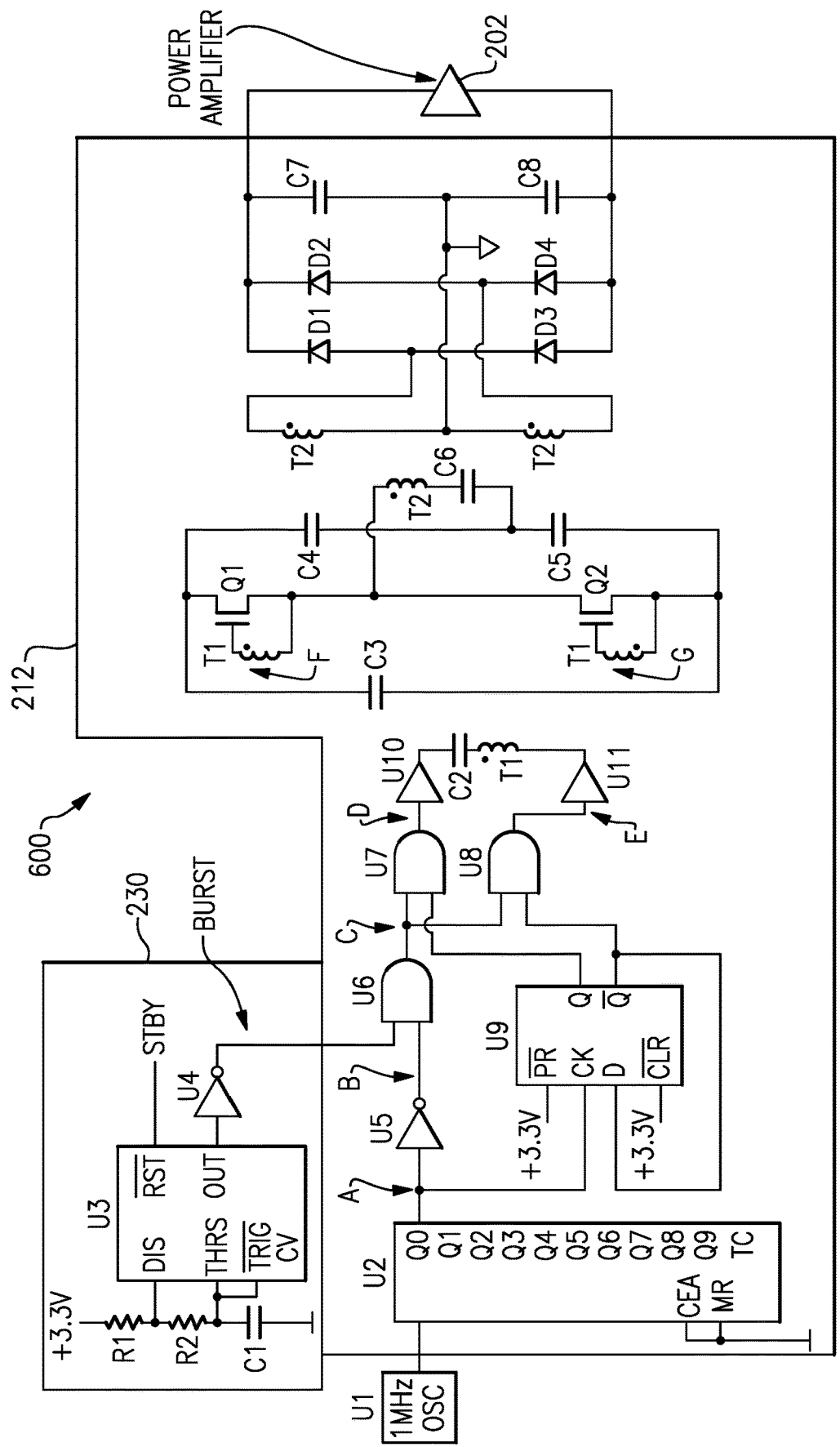
FIG. 6 illustrates a circuit diagram of an embodiment of a power supply and burst generator that can be included in the audio amplifier system of FIG. 2 in accordance with certain embodiments.
Figure 7:
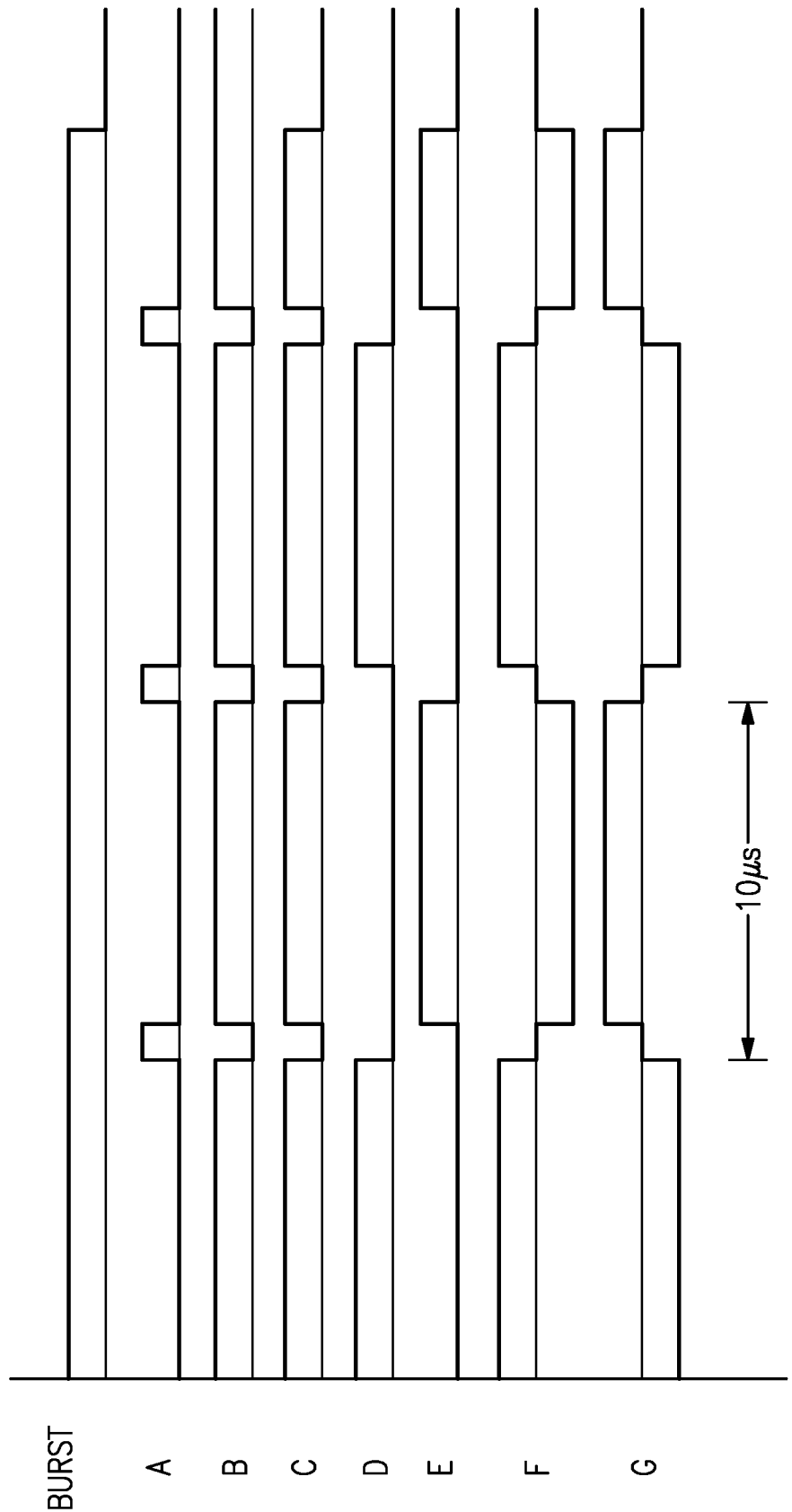
FIG. 7 presents a set of signal timing diagrams illustrating an example operation of the circuits of FIG. 6 in accordance with certain embodiments.
Figure 8:
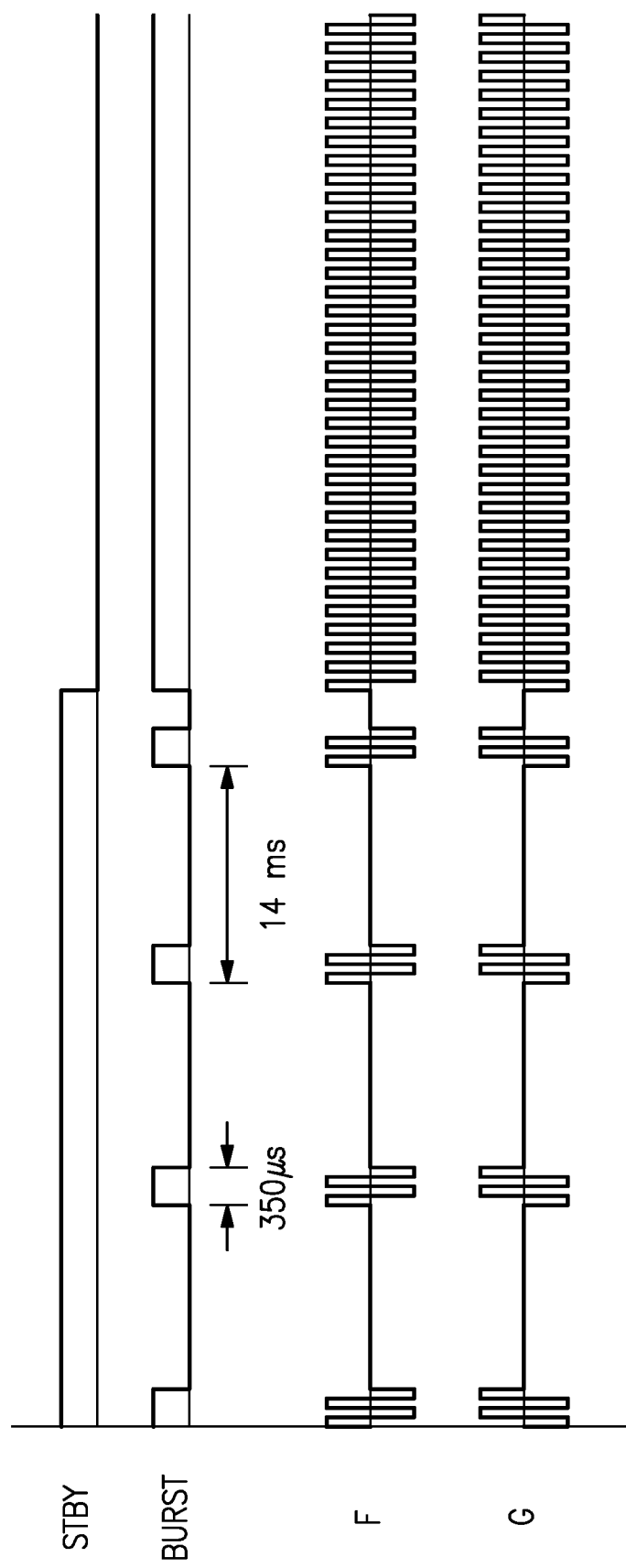
FIG. 8 presents a second set of signal timing diagrams illustrating an example operation of the circuits of FIG. 6 in accordance with certain embodiments.

FIG. 6 illustrates a circuit diagram 600 of an embodiment of an isolated power supply 212 and burst generator 230 that can be included in the audio amplifier system 200 of FIG. 2 in accordance with certain embodiments. FIG. 7 presents a set of signal timing diagrams illustrating an example operation of the circuits of FIG. 6 in accordance with certain embodiments. FIG. 8 presents a second set of signal timing diagrams illustrating an example operation of the circuits of FIG. 6 in accordance with certain embodiments.

Referring to FIG. 6, in some cases, the isolated power supply 212 may be a switched mode power supply. The isolated power supply 212 may receive as an input an oscillator signal from an oscillator U1. Alternatively, the oscillator U1 may be included as part of the isolated power supply 212. In some non-limiting embodiments, the oscillator signal is a 1 MHz signal. However, it should be understood that other frequencies are possible. For example, the oscillator signal may be any frequency between 20 kHz and 2 MHz. In some cases, the frequency may be greater than 2 MHz.

The oscillator signal generated by the oscillator U1 may be fed to a counter U2. The counter U2 may be used to periodically generate a signal based on the oscillator signal. For example, the counter U2 can be used to output an "ON" signal once every ten cycles with the counter U2 outputting an "OFF" signal the remaining 9 cycles. Thus, in some cases, over a 10 μs period, the counter U2 may be ON for 1 μs and OFF for 9 μs. It should be understood that ON/OFF or I/O signals may be a matter of convention and the inverse signals may be generated by the counter U2. The counter U2 may include any type of counter that can be used to create the periodic ON or 1 signals and the OFF or 0 signals. For example, the counter U2 may be a ring counter, such as a Johnson counter (e.g., a 74HCT4017 from Nexperia), which can result in an output on the Q0 pin as shown in waveform A of FIG. 7. As illustrated by waveform A, the signal is high for 1 μs with a 10 μs period.

Returning to FIG. 6, the counter U2 can output a pulse sequentially on each of its outputs. In the illustrated example, there are ten outputs Q0-Q9. Thus, one-tenth of the time, Q0 goes high. The output of the counter U2 may be supplied to an inverter U5 to generate an inverted version of the signal generated by the counter U2, which is therefore high nine-tenths of the time. This inverted signal is illustrated by waveform B of FIG. 7. As illustrated by waveform B, the inverted signal may be high for 9 μs with or over a 10 μs period. The output of the inverter U5 may be supplied to an AND gate U6 along with a burst signal output by the burst generator 230.

With reference to FIG. 6, the burst generator 230 may receive a standby signal ("STBY") from the control system 220. As described above, the STBY signal may be generated in response to interaction with a standby switch 222, or other user interface element. Alternatively, or in addition, the STBY signal may be generated in response to a timer 226 determining that the signal presence detector 224 has not detected a signal (e.g., an audio input) for a threshold period of time. In some cases, the STBY signal is output whenever the audio amplifier system 200 is on, but the value of the STBY signal may change based on the control system 220. For example, the STBY signal may be logic high or ON when the standby switch 222 is ON or when an audio input signal is not detected for a threshold period of time. Conversely, the STBY signal may be logic low or OFF when the standby switch 222 is ON or when an audio input signal is detected. One example of the STBY signal is illustrated in FIG. 8. In the non-limiting example of FIG. 8, the audio amplifier system 200 is in standby for a first period of time (approximately 46.67 ms in the illustrated example), and then exits standby (e.g., enters an ON mode) for the next period of time.

The standby signal may be provided to a timer U3 (e.g., a LMC555 from Texas Instruments). The output of the timer U3 may be supplied to an inverter U4. In addition to the timer U3 and inverter U4, the burst generator may include resistors R1 and R2, and capacitor C1.

The output of the inverter U4 is the burst signal, which may be supplied to the AND gate U6 along with the previously described output of the inverter U5. The burst signal is illustrated as the BURST waveform in FIG. 7 and FIG. 8. As seen in FIG. 7, when the STBY signal is low, the BURST signal goes high allowing for continuous operation of the power supply. Referring to FIG. 8, it can be seen that when the STBY signal is low, the BURST signal stays high and the gate drive signals represented by F and G operate with their normal duty cycle (e.g., alternating between high and low every 10 μs in the illustrated non-limiting example). However, when the STBY signal is high, the BURST signal has, in one non-limiting example, a 14 ms period with an ON time of 350 μs. During the ON time, the gate drive signals operate with their normal duty cycle, but during the remaining time, the gate drive signal is low or not active. Thus, the signal 300 of FIG. 3A may represent the BURST signal and the signal 310 of FIG. 3B may illustrate the gate drive signals operating when the BURST signal is high.

The BURST signal is ANDed with the output of the inverter U5 by the AND gate U6, resulting in waveform C of FIG. 7. Comparing waveform C to waveform A, it can be determined that waveform C matches waveform A unless or until the BURST signal is low. Once BURST goes low, waveform C, which helps control the gate drivers U10 and U11 goes low. Further, as illustrated in FIG. 7, in some non-limiting examples, the waveform C may be high or ON for 9 μs while being low or OFF for 1 μs when using a 10 μs period or cycle.

Returning to FIG. 6, the flip-flop U9 may operate in conjunction with the AND gates U7 and U8 to effectively alternate the 9 μs ON interval between output D and output E. The alternating outputs of the waveforms D and E are illustrated in FIG. 7. As can be seen when comparing waveforms C, D, and E, the waveform D (corresponding to the output of AND gate U7) may be ON for 9 μs when C is high or ON. After an occurrence of a 1 μs pulse, the waveform D goes low and then waveform E (corresponding to the output of AND gate U8) is ON for 9 μs while waveform D stays low. While the BURST signal is high when the audio amplifier system 200 is in standby mode, the waveforms D and E will continue to alternate which signal is ON for 9 μs.

The output of the AND gates U7 and U8, represented by waveforms D and E respectively, may be provided to gate drivers U10 and U11. The gate drivers U10 and U11 may supply a gate drive signal to the primary winding of transformer T1, where C2 is a small DC blocking capacitor. Applying the gate driver signals D and E across the primary winding of transformer T1 results in the drive signals F and G corresponding to the signals D and E being applied across the secondary windings of the transformer T1. The drive signals F and G correspond to the waveforms F and G illustrated in FIGS. 7 and 8. It should be appreciated that the difference in the waveforms of FIGS. 7 and 8 are due to scale. Further, in some cases, the PWM reference above may be replaced by the gate drivers U10 and U11 as modulating the signal is unnecessary.

The gate drive signals F and G alternately turn Q1 and Q2 on for a 9 μs interval. The switches Q1 and Q2 may be FETs. The gate drive signals F and G that are driving the gates Q1 and Q2 create a square wave signal across the primary winding of transformer T2. Each of the secondary windings of the transformer T1 receive the gate drive signals as represented by F and G. However, as indicated by the dot at the top of the winding F and at the bottom of the winding G, the gate drive signals may be out of phase. In other words, as illustrated in FIG. 7, the waveform F may be of the opposite phase of the waveform G. The primary winding of the transformer T2 may be in series with a resonant capacitor C6. Further, the switches Q1 and Q2 may each be connected to a pair of power supply capacitors C4 and C5 as illustrated in FIG. 6. The values of the capacitors C4, C5, and C6 may be relatively small compared to the value of the capacitor C3, which receives the input from the PFC 214. For example, the capacitance value of the capacitors C4, C5, and C6 may be less than 1 mF, while the value of the capacitor C3 may be hundreds to thousands of microfarads. It should be understood that other values for the capacitors are possible. However, generally the value of the capacitor C3 is significantly larger than the value of the capacitors C4, C5, and C6. Further, although the values of the capacitors C4, C5, and C6 are relatively small compared to the value of the capacitor C3, it should be understood that the values of the capacitors C4, C5, and C6 may be the same or may differ from each other.

The alternating pulses or signals generated by the gate drivers U10 and U11, which alternatively turn Q1 and Q2 on, keep the capacitors C7 and C8 charged. By keeping the capacitors C7 and C8 of the isolated power supply 212 charged, the wake time for the isolated power supply 212, and consequently the power supply 210, may be reduced. As can be seen in FIG. 7, when the BURST signal goes low, and the gate driver control associated with waveform C goes low, the gate drive signals corresponding to the waveforms F and G also cease or go low.

The square wave signal across the primary winding of the transformer T2 is reproduced on the secondary windings of the transformer T2. Further, the gap between the primary windings of the transformer T2 and the secondary windings of the transformer T2 creates an isolation boundary between a primary of the isolated power supply 212 and the secondary of the isolated power supply 212. Both the isolation boundary between the primary winding and secondary winding of the transformer T1 and the isolation boundary between the primary winding and secondary winding of the transformer T2 may provide galvanic isolation to help block stray currents.

The reproduced square wave signal may be rectified by a set of diodes D1, D2, D3, and D4. Further, the rectified signal may be smoothed to DC by the output capacitors C7 and C8. The capacitors C7 and C8 represent the capacitors to be maintained in a charge state when the audio amplifier system 200 is in standby mode, thereby reducing wake time for the power supply 210 when the audio amplifier system 200 exits standby mode.

The capacitors C7 and C8 may be implemented as a single electrolytic capacitor or as a bank of several capacitors. Further, the capacitors C7 and C8 may be the output of the isolated power supply 212. In some implementations, the capacitors C7 and C8 may be charged at the same time and may remain charged to their full or normal operating voltage when the power supply 210 is operating in standby mode. In some cases, the normal operating charge of the capacitors C7 and C8 may be less than the full charge the capacitors are capable of supporting. In some such cases, when operating in standby, the capacitors C7 and C8 may be maintained at a charge that is below the maximum charge supported by the capacitors C7 and C8. For example, the capacitors C7 and C8 may be maintained at 90% of their charge to prevent, for example, any overcharge effects (e.g., breakdown of the capacitor).

As indicated above, the gate drive signals F and G are illustrated as waveforms F and G in FIG. 7. The waveforms F and G are repeated in FIG. 8 with a larger time scale that illustrates one non-limiting embodiment with 350 µs burst signals occurring once every 14 ms period. Further, as each pulse of the gate drivers U10 and U11 corresponding to wave forms F & G illustrated in FIG. 7 is approximately 10 µs, each burst illustrated in FIG. 8 for the waveforms F & G have approximately 35 squarewave pulses comprised of both positive and negative squarewave pulses. These pulses may alternate between positive and negative pulses.

As illustrated in FIG. 2, the isolated power supply 212 may receive an input from a PFC circuit 214. The capacitor C3 of the isolated power supply 212 may represent the output of the PFC circuit 214. Further, the capacitor C3 may be a single electrolytic capacitor or a bank of several capacitors. The capacitor C3 may remain charged to its operating voltage when the audio amplifier system 200, and consequently the power supply 210, is operating in standby mode. The capacitor C3 may be kept charged by the PFC circuit 214.

The capacitors C4 and C5 may be small value film capacitors. The capacitors C4 and C5 may be charged by the PFC circuit 214 to their operating voltage even when the audio amplifier system 200, and consequently the power supply 210, is operating in standby mode. In other words, the PFC circuit 214 may keep the capacitors C3, C4, and C5 charged. Further, the capacitor C6 may be a small value film capacitor that has a small AC signal across it for DC blocking. The AC signal may be kept across the capacitor C6 regardless of whether the power supply 210 is operating in a standby mode or a normal operating mode.

Example Power Supply Circuit with Reduced Peak Current

When the power supply 210 operates in standby mode, a peak current draw may occur immediately or shortly after entering standby mode. The peak current draw may occur because the isolated power supply 212 operates at its full duty cycle when the BURST signal is received. Thus, for the period of time when the isolated power supply 212 is active and charging the output capacitors, the audio amplifier system 200 is operating at full power.

In certain embodiments, it is possible to further reduce power used by the audio amplifier system 200 by ramping the duty cycle in standby mode from a minimum duty cycle (Dmin) to a maximum duty cycle (Dmax) during each burst cycle. More specifically, the duty cycle of the gate drivers U10 and U11 of the isolated power supply 212 are ramped in standby mode from Dmin to Dmax. In other words, using the prior example of a 350 µs BURST signal, instead of immediately operating the isolated power supply 212 at Dmax, the isolated power supply 212 may initially operate at Dmin and ramp up to Dmax thereby reducing the peak current draw during the BURST time. The isolated power supply 212 may use about 1 Watt of power when operating in the standby or burst mode. By ramping the duty cycle from Dmin to Dmax during the burst cycle of the standby mode, the power may be reduced by approximately 50%. In some cases, the power reduction may be more or less based, for example, on the selected duty cycle of Dmin and the ramp time between Dmin and Dmax.

The minimum duty cycle Dmin may be configured as some non-zero duty cycle. For example, Dmin may be a 5% or 10% duty cycle, or may be 5% or 10% of the maximum duty cycle. The maximum duty cycle, Dmax, may be associated with or derived from a clock or oscillator signal and may be associated with a percentage of a time that the gate drivers U10 and U11 are active. Further, Dmax may be chosen to be less than the maximum allowable duty achievable by the isolated power supply 212. For example, Dmax may be configured to be 80%, 85%, 90%, 95%, etc. A duty cycle of 90% may indicate that the gate drivers U10 and U11 are active 90% of the time.

Figure 9:
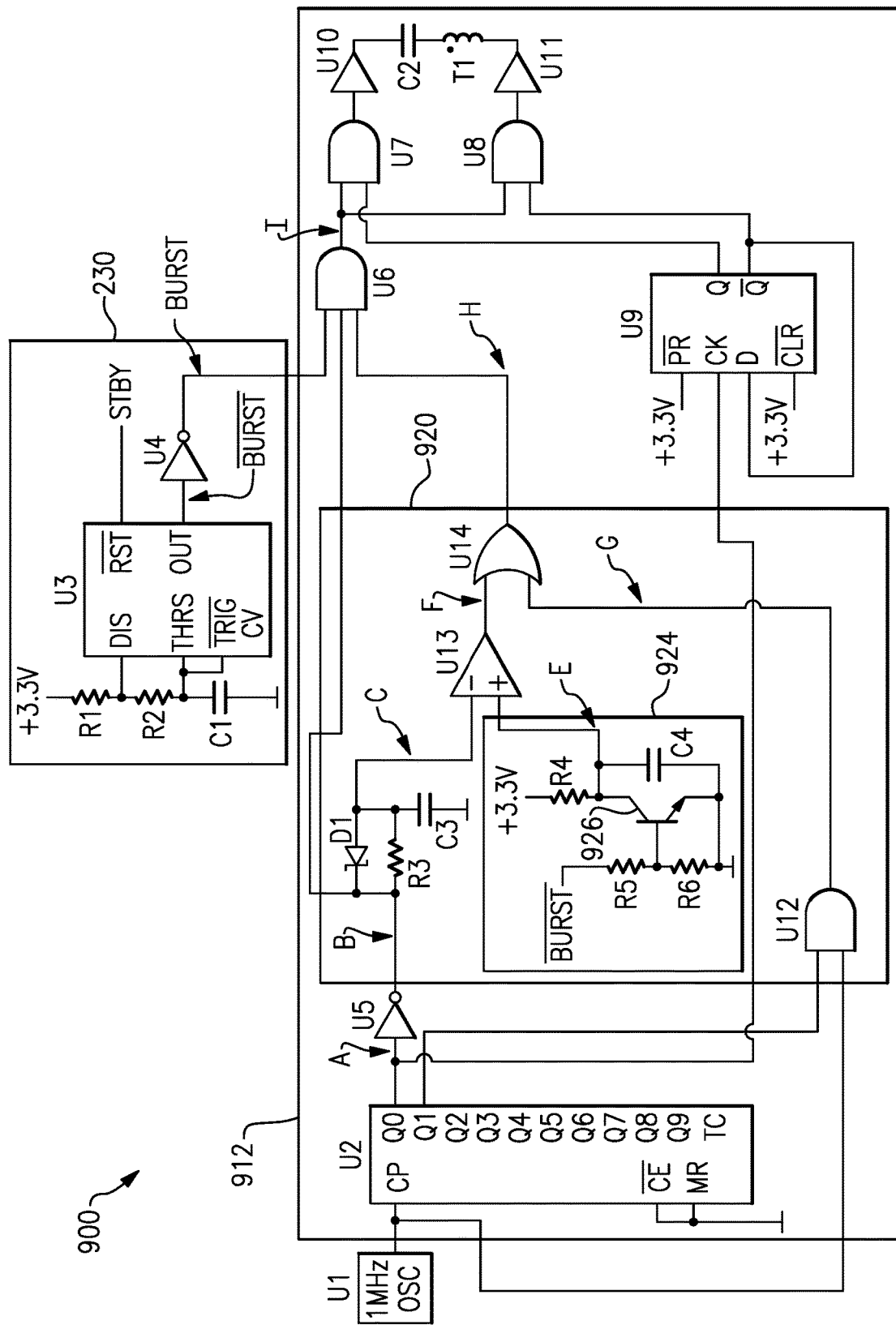
FIG. 9 illustrates a circuit diagram of an embodiment of a power supply that includes a duty cycle ramp generator that can be included in the audio amplifier system of FIG. 2 in accordance with certain embodiments.

FIG. 9 illustrates a circuit diagram 900 of an embodiment of an isolated power supply 912 that includes a duty cycle ramp generator 920 that can be included in the audio amplifier system 200 of FIG. 2 in accordance with certain embodiments. It should be understood that the isolated power supply 912 is a portion of the isolated power supply and that the isolated power supply 912 may further include corresponding undepicted portions of the isolated power supply 212 that may be driven by the gate drivers U10 and U11.

Figure 10:
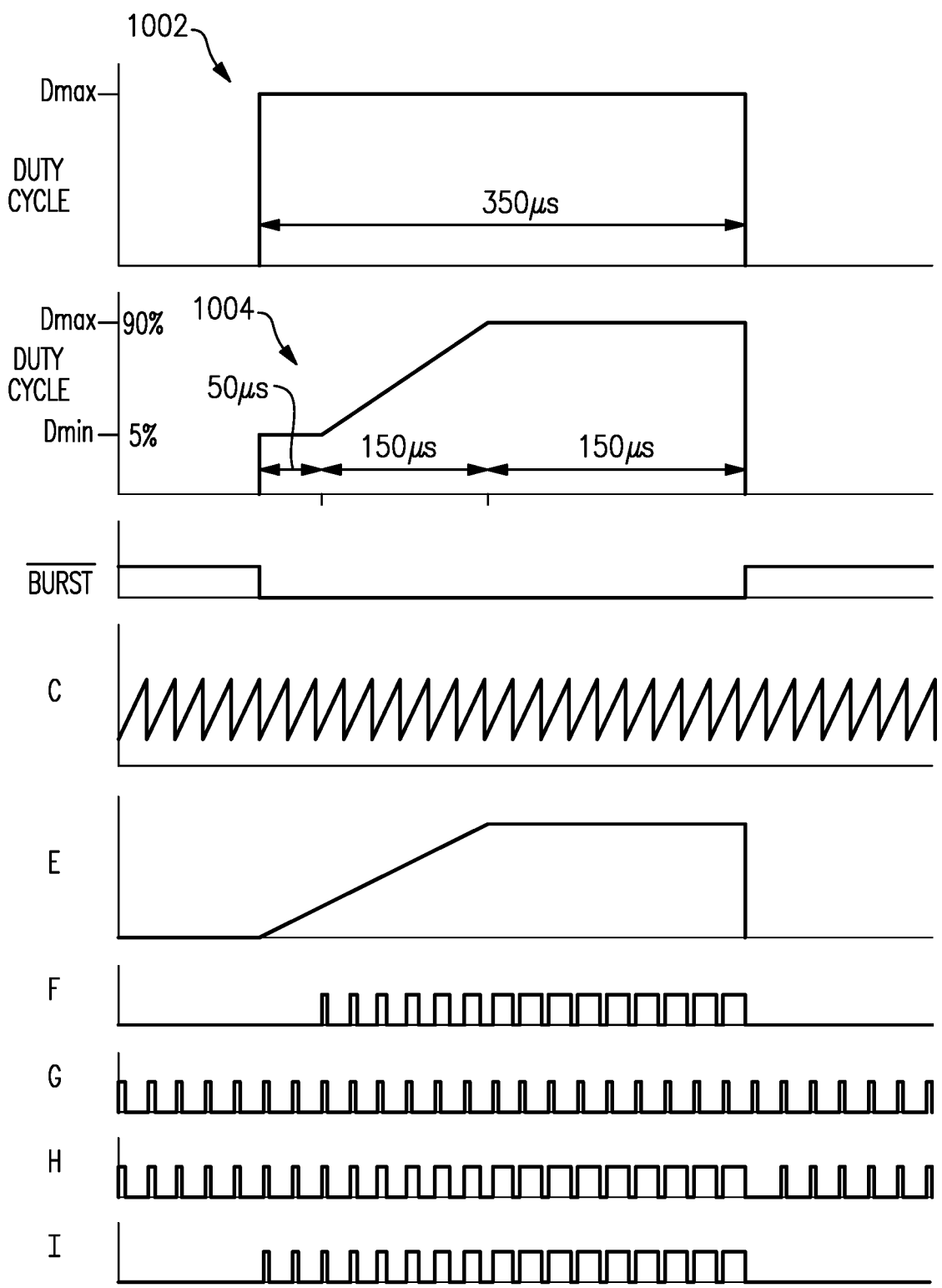
FIG. 10 presents a set of signal timing diagrams illustrating an example operation of the circuits of FIG. 9 in accordance with certain embodiments.

FIG. 10 presents a set of signal timing diagrams illustrating an example operation of the circuits of FIG. 9 in accordance with certain embodiments. The graph 1002 of FIG. 10 illustrates the duty cycle of a single BURST pulse of 350 μs corresponding to a single BURST pulse as illustrated in FIG. 8 of the isolated power supply 212. As illustrated by the graph 1002, the duty cycle during the BURST pulse may be at Dmax the entirety of the pulse. The graph 1004 of FIG. 10 illustrates the duty cycle of a single BURST pulse of 350 μs of an isolated power supply 912 that includes the duty cycle ramp generator 920. As illustrated by the graph 1004, the duty cycle may begin at some minimum value Dmin (e.g., 5%) and may remain at the minimum for a period of time (e.g., 50 μs) before ramping up to some maximum Dmax (e.g., 90%) over some period of time (e.g., 150 μs) where it may remain until the BURST signal drops to low (e.g., until the BURST pulse ends). In some cases, the duty cycle of the isolated power supply 912 may ramp from Dmin to Dmax without remaining at Dmin for some period of time. Further, in some cases, the period over which Dmin ramps to Dmax may be less than or greater than 150 μs. In other words, in some cases, the slope from Dmin to Dmax illustrated in graph 1004 may differ. The remaining graphs of FIG. 10 are aligned with the graph 1004. For example, as the not BURST signal goes from high to low, the BURST pulse illustrated by the graph 1004 goes from low to Dmin.

As illustrated in FIG. 9, the isolated power supply 912 may include a ramp generator 920. Further, similar to the isolated power supply 212, the isolated power supply 912 may include the inverter U5, which may receive a signal from a counter U2 (e.g., a Johnson counter) and may provide the output of the inverter U5 to the AND gate U6. However, while the AND gate U6 of the isolated power supply 212 may be a two-input AND gate that receives the BURST signal and the output of the inverter U5, the AND gate U6 of the isolated power supply 912 may be a three-input AND gate that receives a signal from a ramp generator 920 in addition to the BURST signal from the burst generator 230 and the signal from the inverter represented by the waveform B of FIG. 7.

The ramp generator 920 may include a Dmin generator U12. The Dmin generator U12 may receive a signal from the counter U2 that is ANDed with the oscillator signal from the oscillator U1 by the Dmin generator U12 to create the Dmin signal. The signal supplied to the Dmin generator U12 may be a different signal or counter value than the signal provided by the counter U2 to the inverter U5, and may be referred to as a duty cycle control signal. The signal output by the Dmin generator may be some fraction of the total BURST period. For example, if the BURST period is 10 μs, the signal output by the Dmin generator U12 may be high or ON for 500 ns of the 10 μs period resulting in a duty cycle of 5% or a Dmin of 5%. The output of the Dmin generator U12 may be supplied to an OR gate U14 along with an output of a comparator U13.

The comparator U13 may enable ramping from the Dmin duty cycle to the Dmax duty cycle. The noninverting input of the comparator U13 may include a ramping circuit 924 that receives the inverse of the BURST signal and controls the ramping between Dmin and Dmax in response to the inverse of the BURST signal. In other words, the signal output by the timer U3 may be supplied to the ramping circuit 924 as an input to the ramping circuit 924. The ramping circuit 924 may include a transistor 926. This transistor may be any type of transistor. For example, the transistor 926 may be an NPN transistor.

When the burst generator 230 first outputs a low BURST signal, a high "NOT" BURST signal is supplied to the ramping circuit 924. Further, the transistor 926 is turned on and initially brings the voltage across the capacitor C4 down to zero or close to zero volts. The voltage across the capacitor C4 when the transistor 926 is first turned on may depend on the type of transistor or switch used to implement transistor 926 and the current through it. In some non-limiting examples, the initial voltage across the capacitor C4 may be on the order of a few tens of millivolts. The current through the resistor R4 then charges the capacitor C4 when the transistor 926 is off providing the ramp from Dmin to Dmax. This ramped voltage is supplied to the noninverting input of the comparator U13. The RC time constant, or the time to charge the capacitor C4, may be on the order of 350 μs, which is equal to a burst signal pulse in the examples illustrated in FIGS. 7 and 8. In some cases, the RC time constant may be less than the period of a burst signal pulse. For example, the RC time constant may be 150 μs or 200 μs. The waveform E of FIG. 10 (not to be confused with the waveform E of FIG. 7) illustrates the charging of the capacitor C4 from 0 volts to a supply voltage over an RC time constant of approximately 200 μs as the duty cycle ramps from Dmin to Dmax. It should be understood that the charge time or the RC time constant may vary based on the supply voltage and/or the size of the resistor and/or capacitor of the RC circuit.

At the inverting input to the comparator U13, the ramp generating circuit 920 includes a similar RC construct that charges the capacitor C3 at the switching frequency. The RC time constant of the capacitor C3 may be 9 μs providing for a ramp during the 9 μs of on time for each cycle occurring during the 350 μs BURST pulse. Examining the waveform C of FIG. 10 corresponding to the voltage across the capacitor C3, it can be determined that the voltage may be offset. This voltage may be a byproduct of the forward voltage of D1 and the non-zero voltage output by the inverter U5, which, in total, may be on the order of a few hundred mV. The diode D1 allows C3 to discharge "quickly" when the inverter U5 output is pulled down and allows the voltage across R3 and C3 to ramp up when the inverter U5 output is pulled up, thus, yielding waveform C. As illustrated in FIG. 9, the diode D1 may be a Schottky barrier diode.

The comparator U13 outputs the result of the comparison of the charge on the capacitor C4 (represented by the waveform E of FIG. 10) and the charge on the capacitor C3 (represented by the waveform C of FIG. 10). The output of the comparator U13 is represented by waveform F of FIG. 10. The comparator U13 outputs a '1' or a high signal when the ramp signal output by the ramping circuit 924 is higher than the charge of the capacitor C3. Over time, as the ramp signal output increases, the time that the ramp signal output is higher than the charge of the capacitor C3 increases. This difference is illustrated by the increasingly larger and larger pulses of the waveform F until duty cycle Dmax is reached. Once Dmax is reached, the pulses output by the comparator U13 reach a maximum period. The pulses shown in waveform F of FIG. 10 may be a representation of the T2 (of FIG. 6) switch mode operation as illustrated by the waveforms F and G of FIGS. 7 and 8. In this non-limiting example, out of each 10 ms period there is 1 ms of "dead time" to prevent the transistors Q1 and Q2 from being on at the same time to prevent shoot-through current, or the rush of current that can occur when both transistors Q1 and Q2 are simultaneously on. It is desirable to avoid a shoot-through current as such an occurrence can damage system components.

The output of the comparator U13 is provided to the OR gate U14 along with the Dmin value (represented by the waveform G of FIG. 10) generated by the AND gate U12. The Dmin value represented by waveform G remains steady during operation of the power supply. However, in some cases, Dmin may vary in response to a control signal. The output of the OR gate U14 is represented by the waveform H of FIG. 10 and is the output of the ramp generator 920. As illustrated by the waveform H, the pulses may match the waveform F when the BURST signal is high corresponding to the ramping of the duty cycle from Dmin to Dmax. However, when the BURST signal is low, the waveform H may match the waveform G. As the BURST signal being low results in the gate drivers being inactive as illustrated by waveform I, the output of the ramp generator 920 does not impact operation of the isolated power supply 912 when the BURST signal is low.

The output of the ramp generator 920 is provided to the AND gate U6 along with the BURST signal and the inverted signal of the counter U2 as output by the inverter U5. The output of the AND gate U6 is represented by waveform I. The output of the AND gate U6 is used to control the gate drivers U10 and U11, which in turn charge the output capacitors of the power supply as previously described above with respect to FIG. 6. As illustrated by waveform I, the gate drivers U10 and U11 may be active when the BURST signal is high (or the not BURST is low). However, as illustrated by waveform I of FIG. 10, the pulses are initially relatively small corresponding to the Dmin duty cycle and lengthen over time as the duty cycle ramps up to Dmax. By ramping the duty cycle between Dmin and Dmax, it is possible to reduce peak current draw and thereby reduce power consumption by the isolated power supply 912 compared to the isolated power supply 212, which may be yet a further reduction in power consumption compared to power supplies that do not implement a standby or sleep mode. Moreover, by using embodiments disclosed herein, the wake time for a power supply to switch between standby mode and normal or non-standby operating mode may be reduced.

Terminology

It is to be understood that not necessarily all objects or advantages may be achieved in accordance with any particular embodiment described herein. Thus, for example, those skilled in the art will recognize that certain embodiments may be configured to operate in a manner that achieves or optimizes one advantage or group of advantages as taught herein without necessarily achieving other objects or advantages as may be taught or suggested herein.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The term "coupled" is used to refer to the connection between two elements, the term refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the inventions are not intended to be exhaustive or to limit the inventions to the precise form disclosed above. While specific embodiments of, and examples for, the inventions are described above for illustrative purposes, various equivalent modifications are possible within the scope of the inventions, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the inventions provided herein can be applied to other systems, not necessarily the system described above. The elements and acts of the various embodiments described above can be combined to provide further embodiments.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. An audio amplifier comprising:
a power amplifier configured to amplify an input audio signal to obtain an amplified audio signal and output the amplified audio signal to a speaker; and
an isolated power supply comprising one or more capacitors, a duty cycle ramp generator, and a burst mode input configured to receive a burst mode signal indicating whether the audio amplifier is in a standby state, wherein, when the burst mode signal indicates that the audio amplifier is in the standby state, the isolated power supply cycles between an active state and an inactive state, and wherein the duty cycle ramp generator ramps a duty cycle of a gate driver from a minimum duty cycle to a maximum duty cycle during the active state to charge the one or more capacitors of the isolated power supply.

2. The audio amplifier of claim 1, wherein the minimum duty cycle is less than 10% and the maximum duty cycle is at least 80%.

3. The audio amplifier of claim 1, wherein the duty cycle ramp generator includes a ramping circuit configured to control the ramping of the gate driver from the minimum duty cycle to the maximum duty cycle.

4. The audio amplifier of claim 1, wherein the minimum duty cycle is configured in response to a duty cycle control signal.

5. The audio amplifier of claim 4, further comprising a counter configured to generate the duty cycle control signal.

6. The audio amplifier of claim 1, further comprising a burst generator configured to generate the burst mode signal in response to a control signal and to provide the burst mode signal to the burst mode input.

7. The audio amplifier of claim 6, further comprising a controller configured to generate the control signal based on a determination that the audio amplifier is in the standby state.

8. The audio amplifier of claim 1, wherein charging the one or more capacitors of the isolated power supply when in the standby state reduces a wake time of the audio amplifier when transitioning from the standby state to an on state compared to when the one or more capacitors are uncharged.

9. The audio amplifier of claim 1, wherein a length of time that the isolated power supply is in the active state during standby mode is at least a magnitude less than a length of time that the isolated power supply is in the inactive state.

10. The audio amplifier of claim 1, wherein the gate driver is one of a pair of gate drivers included in the isolated power supply, and wherein the pair of gate drivers alternatingly turn on a corresponding pair of transistors to charge the one or more capacitors of the isolated power supply when the isolated power supply is in the active state.

11. A method of controlling an audio amplifier that supports a standby mode with fast wake-up, the method comprising:
receiving a command to cause the audio amplifier to enter the standby mode;
generating a control signal to enter the standby mode in response to the command;
activating a burst generator configured to generate a burst mode signal in response to the control signal and to provide the burst mode signal to a burst mode input of an isolated power supply; and
in response to the isolated power supply receiving the burst mode signal,
charging one or more capacitors of the isolated power supply over a first time period by at least ramping a duty cycle of a gate driver of the isolated power supply from a first duty cycle to a second duty cycle that is higher than the first duty cycle; and
ceasing to charge the one or more capacitors by at least deactivating the gate driver during a second time period.

12. The method of claim 11, further comprising, in response to the isolated power supply receiving the burst mode signal, periodically repeating said charging of the one or more capacitors and said ceasing to charge the one or more capacitors.

13. The method of claim 11, wherein ceasing to charge the one or more capacitors comprises supplying a low gate driver control signal to the gate driver.

14. The method of claim 11, wherein the first time period is a magnitude of time shorter than the second time period.

15. The method of claim 11, further comprising:
determining that the audio amplifier is to exit the standby mode;
deactivating the burst generator; and
activating the isolated power supply.

16. The method of claim 11, wherein the command to cause the audio amplifier to enter the standby mode is received in response to at least one of: a user interaction with a standby user interface element or detecting an absence of an input audio signal for a threshold period of time.

17. An audio system comprising:
a speaker configured to output audio; and
an audio amplifier in communication with the speaker and configured to provide an audio signal to the speaker, wherein the speaker outputs the audio based on the audio signal, wherein the audio amplifier comprises:
a power amplifier configured to amplify an input audio signal to obtain the audio signal and output the audio signal to the speaker; and
an isolated power supply configured to power the power amplifier, the isolated power supply comprising one or more capacitors, a duty cycle ramp generator, and a burst mode input configured to receive a burst mode signal indicating whether the audio amplifier is in a standby state, wherein, when the burst mode signal indicates that the audio amplifier is in the standby state, the isolated power supply cycles between an active state and an inactive state, and wherein the duty cycle ramp generator ramps a duty cycle of a gate driver from a minimum duty cycle to a maximum duty cycle during the active state to charge the one or more capacitors of the isolated power supply.

18. The audio system of claim 17, wherein the duty cycle ramp generator includes a ramping circuit configured to control the ramping of the gate driver from the minimum duty cycle to the maximum duty cycle.

19. The audio system of claim 18, wherein the ramping circuit comprises a transistor configured to charge a capacitor of an RC circuit to ramp the duty cycle of the gate driver.

20. The audio system of claim 17, further comprising a burst generator configured to generate the burst mode signal in response to a control signal associated with entering the standby state and to provide the burst mode signal to the burst mode input.

* * * * *